(12) United States Patent
Tanaka et al.

(10) Patent No.: US 7,326,630 B2
(45) Date of Patent: Feb. 5, 2008

(54) METHOD OF FABRICATING SEMICONDUCTOR DEVICE UTILIZING LASER IRRADIATION

(75) Inventors: Koichiro Tanaka, Atsugi (JP); Hidekazu Miyairi, Tochigi (JP); Hironobu Shoji, Machida (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 268 days.

(21) Appl. No.: 10/815,813

(22) Filed: Apr. 2, 2004

(65) Prior Publication Data

US 2004/0198028 A1    Oct. 7, 2004

(30) Foreign Application Priority Data

Apr. 4, 2003 (JP) .............................. 2003-101312

(51) Int. Cl.
*H01L 21/20* (2006.01)
*B23K 26/06* (2006.01)

(52) U.S. Cl. ................ 438/487; 438/535; 219/121.73; 219/121.75

(58) Field of Classification Search ............ None
See application file for complete search history.

(56) References Cited

U.S. PATENT DOCUMENTS

| | | |
|---|---|---|
| 5,304,357 A | 4/1994 | Sato et al. |
| 5,543,352 A | 8/1996 | Ohtani et al. |
| 5,612,250 A | 3/1997 | Ohtani et al. |
| 5,612,251 A | 3/1997 | Lee |
| 5,643,801 A | 7/1997 | Ishihara et al. |
| 5,643,826 A | 7/1997 | Ohtani et al. |
| 5,718,036 A * | 2/1998 | Oji et al. ............ 29/603.12 |
| 5,767,003 A | 6/1998 | Noguchi |
| 5,854,803 A | 12/1998 | Yamazaki et al. |
| 5,897,799 A | 4/1999 | Yamazaki et al. |
| 5,900,980 A | 5/1999 | Yamazaki et al. |
| 5,923,962 A | 7/1999 | Ohtani et al. |
| 5,953,597 A | 9/1999 | Kusumoto et al. |
| 5,959,779 A | 9/1999 | Yamazaki et al. |
| 6,002,523 A | 12/1999 | Tanaka |
| 6,020,224 A | 2/2000 | Shimogaichi et al. |

(Continued)

FOREIGN PATENT DOCUMENTS

EP    0 651 431    5/1995

(Continued)

*Primary Examiner*—Alonzo Chambliss
(74) *Attorney, Agent, or Firm*—Eric J. Robinson; Robinson Intellectual Property Law Office, P.C.

(57) ABSTRACT

Crystallization by irradiation of laser light forms a plurality of convex portions (ridges) on the surface of a crystalline semiconductor film that is obtained, which decreases a film quality. A method of laser irradiation comprises the steps of: overlapping an area which is irradiated with a first laser beam of a pulsed oscillation having a wavelength of equal to or shorter than that of visible light with an area which is irradiated with a second laser beam of a pulsed oscillation having a longer wavelength than that of the first laser beam; and irradiating a subject to be irradiated with the first laser beam and the second laser beam while synchronizing the pulsed oscillation of the first laser beam with that of the second laser beam, and moving the subject to be irradiated, and the first laser beam and the second laser beam relatively each other.

36 Claims, 15 Drawing Sheets

U.S. PATENT DOCUMENTS

| | | | |
|---|---|---|---|
| 6,038,075 A | 3/2000 | Yamazaki et al. | |
| 6,119,335 A * | 9/2000 | Park et al. | 29/830 |
| 6,156,997 A | 12/2000 | Yamazaki et al. | |
| 6,210,996 B1 | 4/2001 | Yamazaki et al. | |
| 6,242,292 B1 | 6/2001 | Yamazaki et al. | |
| 6,246,524 B1 | 6/2001 | Tanaka | |
| 6,248,606 B1 | 6/2001 | Ino et al. | |
| 6,359,254 B1 * | 3/2002 | Brown | 219/121.71 |
| 6,380,009 B1 | 4/2002 | Battersby | |
| 6,423,585 B1 | 7/2002 | Yamazaki et al. | |
| 6,426,245 B1 | 7/2002 | Kawasaki et al. | |
| 6,451,631 B1 | 9/2002 | Grigoropoulos et al. | |
| 6,468,842 B2 | 10/2002 | Yamazaki et al. | |
| 6,528,397 B1 | 3/2003 | Taketomi et al. | |
| 6,544,825 B1 | 4/2003 | Yamazaki | |
| 6,548,370 B1 | 4/2003 | Kasahara et al. | |
| 6,645,454 B2 | 11/2003 | Voutsas | |
| 6,693,257 B1 | 2/2004 | Tanaka | |
| 6,700,096 B2 | 3/2004 | Yamazaki et al. | |
| 6,730,550 B1 | 5/2004 | Yamazaki et al. | |
| 6,750,423 B2 * | 6/2004 | Tanaka et al. | 219/121.73 |
| 6,806,498 B2 | 10/2004 | Taketomi et al. | |
| 6,884,699 B1 | 4/2005 | Ogawa et al. | |
| 6,897,166 B2 | 5/2005 | Sotani et al. | |
| 6,897,889 B2 | 5/2005 | Tanaka | |
| 6,927,109 B1 | 8/2005 | Tanaka et al. | |
| 7,026,194 B2 * | 4/2006 | Suzawa et al. | 438/149 |
| 7,026,227 B2 * | 4/2006 | Tanaka | 438/487 |
| 2001/0052950 A1 | 12/2001 | Yamazaki et al. | |
| 2002/0004292 A1 | 1/2002 | Yamazaki et al. | |
| 2002/0031876 A1 | 3/2002 | Hara et al. | |
| 2002/0048864 A1 | 4/2002 | Yamazaki et al. | |
| 2002/0094008 A1 | 7/2002 | Tanaka | |
| 2002/0146874 A1 | 10/2002 | Kawasaki et al. | |
| 2002/0151115 A1 | 10/2002 | Nakajima et al. | |
| 2003/0003636 A1 | 1/2003 | Grigoropoulos et al. | |
| 2003/0022471 A1 | 1/2003 | Taketomi et al. | |
| 2003/0112322 A1 | 6/2003 | Tanaka | |
| 2003/0136772 A1 | 7/2003 | Yamazaki et al. | |
| 2003/0148565 A1 | 8/2003 | Yamanaka | |
| 2004/0040938 A1 | 3/2004 | Yamazaki et al. | |
| 2004/0069751 A1 | 4/2004 | Yamazaki et al. | |
| 2004/0119955 A1 | 6/2004 | Tanaka | |
| 2004/0169023 A1 | 9/2004 | Tanaka | |
| 2004/0171237 A1 | 9/2004 | Tanaka et al. | |
| 2004/0253838 A1 | 12/2004 | Yamazaki et al. | |
| 2004/0259387 A1 | 12/2004 | Yamazaki et al. | |
| 2004/0266079 A1 | 12/2004 | Shimomura et al. | |
| 2005/0067384 A1 | 3/2005 | Talwar et al. | |
| 2005/0181550 A1 | 8/2005 | Tanaka | |
| 2006/0019474 A1 | 1/2006 | Inui et al. | |

FOREIGN PATENT DOCUMENTS

| | | |
|---|---|---|
| EP | 0 886 319 | 12/1998 |
| EP | 1 049 144 | 11/2000 |
| JP | 04-124813 | 4/1992 |
| JP | 07-187890 | 7/1995 |
| JP | 08-195357 | 7/1996 |
| JP | 2000-012484 | 1/2000 |
| JP | 2001-044120 | 2/2001 |

* cited by examiner

—·—·—·— 1ST PULSE LASER

— — — — — 2ND PULSE LASER

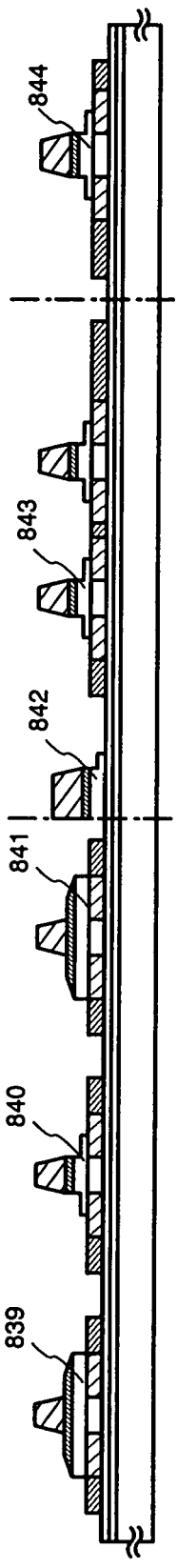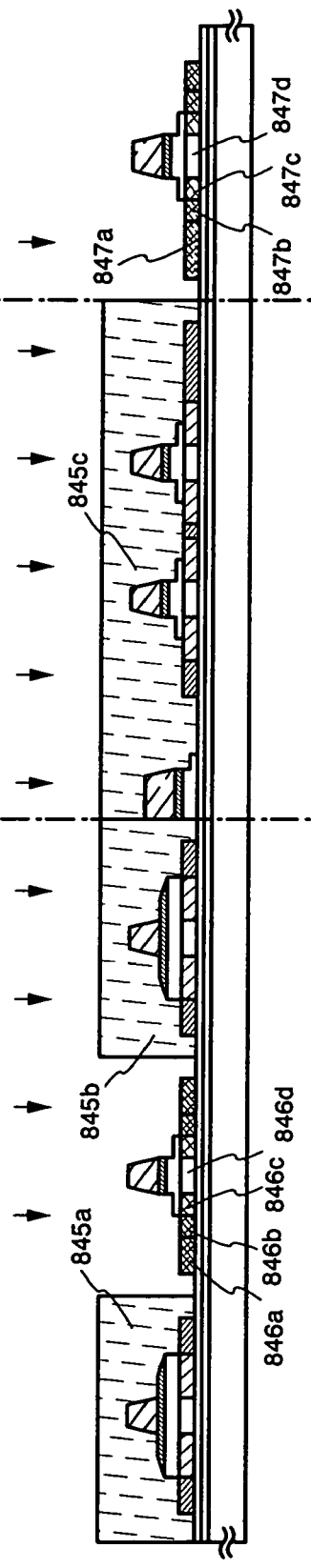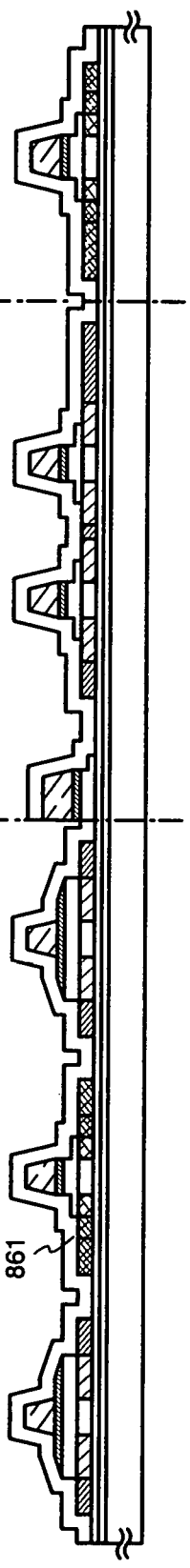
FIG. 7A
FIG. 7B
FIG. 7C

METHOD OF FABRICATING SEMICONDUCTOR DEVICE UTILIZING LASER IRRADIATION

BACKGROUND OF THE INVENTION

1. Field of the Invention

The present invention relates to a method for irradiating a laser light and a laser irradiation apparatus (an apparatus including a laser and an optical system for leading laser light emitted from the laser to a body to be irradiated) for carrying out thereof. In addition, the invention relates to a semiconductor device manufactured by including an annealing (hereinafter, referred to as a laser annealing) a semiconductor film using the laser into a step and to a method for manufacturing thereof.

2. Description of the Related Art

In recent years, a technique to crystallize and to improve crystallinity by carrying out a laser annealing on a semiconductor film formed over an insulating substrate such as a glass has been studied widely. A material having silicon is used often for the semiconductor film. In this specification, a means for obtaining a crystalline semiconductor film by crystallizing a semiconductor film with a laser light is referred to as a laser crystallization. Note that, in this specification, a crystalline semiconductor film is referred to as a semiconductor film wherein a crystallized region exists, which includes a semiconductor film wherein the entire surface is crystallized.

Compared with the synthesize quartz glass substrate which is conventionally used often, a glass substrate is cheap and rich in workability, and has an advantage that a large area substrate can be easily manufactured. This is the reason for carrying out the above research. In addition, the reason why laser is used willingly for a crystallization is because a melting point of a glass substrate is low. A laser can give high energy only to a semiconductor film without raising temperature of a substrate too much. Furthermore, a throughput is extremely high in comparison with a means for heating using an electrically heated reactor.

A crystalline semiconductor film formed by carrying out a laser annealing has high mobility. Therefore, a thin film transistor (TFT) is formed using the crystalline semiconductor film, which is actively used for, for example, a monolithic type liquid crystal electro-optic device wherein TFTs for a pixel drive and a driver circuit are manufactured over a glass substrate.

An example of a method for laser annealing is a method for carrying out an annealing by moving an irradiated position of a laser beam relatively to a body to be irradiated, such that a laser beam of pulsed oscillation, typified by an excimer laser is shaped with an optical system for the purpose of being a square spot with a side of several cm or being a linear shape of 100 mm or more in length. Note that, "linear shape" here does not mean "line" in the proper sense, but means a rectangle (or, oblong) with a high aspect ratio. For example, an aspect ratio of 2 or more (preferably, 10 to 10000) is denoted; however, it may be considered that a shape on an irradiated surface is included in a laser beam (rectangular-shaped beam) that is a rectangular shape. Note that, the laser beam is shaped in a linear shape to ensure an energy density for carrying out enough annealing on a body to be irradiated, and it does not matter whether it is a rectangular shape or a planar shape as long as to carry out enough of an annealing on a body to be irradiated.

In particular, productivity is high when the linear beam is employed since an entire surface to be irradiated can be irradiated with a laser by scanning only to the direction perpendicular to the direction of the major axis of the linear beam, which is different from the case that laser light in a spot shape that a scanning is necessary in back and forth and around is used. The linear beam is scanned to the direction perpendicular to the direction of the major axis since it is a most effective scanning direction. According to this high productivity, it is becoming a mainstream for a manufacturing technique of a liquid crystal display device using a TFT to use a linear beam obtained by processing pulsed excimer laser light with a suitable optical system under a present method of laser annealing (for example, patent document 1 is to be referred to).

[Patent Document 1] Japanese Patent Application Laid-Open No. 8-195357

However, crystallization by irradiation of a laser light forms a plurality of convex portions (ridges) on the surface of a crystalline semiconductor film that is obtained, which decreases a film quality. In other words, when the laser light is irradiated on a semiconductor film, the semiconductor film is momentarily molten and locally expanded, which forms a ridge is formed on the surface of a crystalline semiconductor film in order to absorb internal stress that is generated by the expansion. In addition, the greatest vertical interval between a mountain and a valley of this ridge is around 0.5 to 2 times of a film thickness.

In a TFT of insulated gate type, a potential barrier and a trap state due to a dangling bond, a distortion of a grid, and the like are formed on the ridge of the surface of the crystalline semiconductor film; therefore, an interface level between an active layer and a gate insulating film gets higher. Furthermore, an electric field is easily concentrated in a summit part of the ridge because it is steep, which will be the source of leakage current and finally generates dielectric breakdown resulting in a short-circuits. In addition, the ridge on the surface of the crystalline semiconductor film loses deposition of a gate insulating film deposited by sputtering or CVD, which decreases a reliability such as poor insulation. In recent years, miniaturization and high integration of a semiconductor device are promoted towards high efficiency and low power consumption thereof. Therefore, a technique to make a thin film of a gate insulating film with high reliability is essential; however, the ridge on the surface in a semiconductor film has a high influence on reliability of a gate insulating film, accompanying with a conversion into a thin film of a gate insulating film. In addition, a scattering effect of a surface is given as one of elements that determine an electron field-effect mobility of a TFT. Surface smoothness of interface between an active layer and of a gate insulating film of a TFT has high influence on electron field-effect mobility. Therefore, the more the interface is flat, the more high electron field-effect mobility can be obtained without being affected by scattering. Thus, the ridge affects all characteristics of a TFT on the surface of a crystalline semiconductor film, which also changes a yield rate.

SUMMARY OF THE INVENTION

It is an object of the present invention to provide a laser irradiation device and a method of laser irradiation that can form a semiconductor film having a surface with a high flatness, and a method for manufacturing a semiconductor device using the semiconductor film.

The invention irradiates complementarily a semiconductor film that is an irradiated surface with a harmonic emitted from a pulsed laser and a pulsed laser beam of a fundamental wave having a wavelength of about 1 μm. It is preferable to synchronize pulses of both lasers and to irradiate by overlapping them simultaneously. The invention provides a method of laser irradiation, a laser irradiation device, and a method for manufacturing a semiconductor device that makes it possible to reduce a convexity and concavity of a surface by irradiating a semiconductor film with a laser according to the above method and by controlling a melted time. Note that, the semiconductor device here refers to an entire device that can be operated by utilizing a characteristic of a semiconductor device, which also includes an electro-optic device such as a liquid crystal display device and a light-emitting device, and an electronic device that includes the electro-optic device as a component.

Specifically, in the invention, a part of a semiconductor film is melted with a first pulsed laser having a wavelength region (a wavelength of equal to or shorter than that of visible light is preferable) that is absorbed enough into a semiconductor film, and that adequately can anneal a semiconductor film even though by a spot size of a laser beam is greatly enlarged compared with that of a continuous-wave laser. Then, a melted semiconductor film is irradiated with a second laser having a pulsed fundamental wave (for example, a fundamental wave of Nd: YAG laser) emitted from a laser (for example, infrared radiation of several kW or more) that can obtain more than several hundred times of output compared with a laser that emits a harmonic. That is, it is preferable to emit simultaneously the first laser and the second laser in a step for crystallizing with a laser since the second laser is necessary to be emitted in the state that a part of a semiconductor film is melted. Note that, as the semiconductor film, the first laser beam and the second laser beam are relatively scanned at this time, processing time is shortened and a throughput can be improved. The reason for using here a pulsed fundamental wave laser is that several kW or more of output of peak power can be obtained, and that it is possible to anneal a semiconductor film even by emitting a laser beam, thereby processing a laser beam into a large area; therefore, it is advantageous in respect of a throughput. According to the invention, it is possible to provide the semiconductor film having a surface with a high flatness where ridge is reduced.

The reason why a film with a high flatness is formed according to the invention is explained hereinafter.

A fundamental wave is hardly absorbed into a semiconductor film of non-molten state; however, an absorption coefficient rises significantly to obtain an enough absorption when a semiconductor film is in a non-molten state. Thus, it is possible to continue a molten state for relatively long time by absorbing a fundamental wave into a semiconductor film in a molten state. Note that, an absorption coefficient of a fundamental wave is $5 \times 10^2$/cm or less; on the other hand, an absorption coefficient of $5 \times 10^3$/cm or more is necessary to carry out a treatment (annealing) by giving energy to a semiconductor film. Therefore, an advantageous effect that the invention expects can be obtained in a step for crystallizing with a laser as long as an absorption coefficient of a fundamental wave alters for 10 times or more by melting the semiconductor film.

That is, a molten state can be continued by absorbing a fundamental wave into the semiconductor film in a molten state irradiated with a laser absorbed well into a semiconductor film of a solid-phase state; therefore, it is possible to carry out an annealing on a semiconductor film while controlling a formation of the ridge. Note that, a condition such as a laser output, a pulse width, a frequency of a laser oscillation, and a laser scanning rate may be appropriately selected according to a film thickness, a film quality, and the like. By adjusting the above parameter, temperature variation per unit time of a semiconductor film with laser anneal can be lowered as much as possible, which a formation of ridge by a sudden temperature variation can be further protected.

In a concrete step for crystallizing with a laser, an oscillation of a laser absorbed well into a semiconductor film of a solid-phase state and a laser oscillation of a fundamental wave are carried out by synchronizing with each other such that a molten region is irradiated with a fundamental wave. Note that, it is necessary for a pulse width and a laser output of fundamental wave to be adjusted so that the laser is not output too much to a semiconductor film that is melted by a pulsed laser.

Regarding timing and output of a laser oscillation, they are explained with reference to FIG. 1. In FIG. 1, a vertical axis represents a laser output, and a horizontal axis represents time. In addition, let energy threshold value of a laser output necessary for melting a semiconductor film be "W1", and let energy suitable for crystallizing a semiconductor film be "W0".

In FIG. 1A, a molten region is formed in a semiconductor film by the first pulsed laser having a wavelength region absorbed well into a semiconductor film and the second pulsed laser with a wavelength of around 1 μm. That is, as shown in FIG. 1, it is arranged that the semiconductor film is irradiated with the second pulsed laser during the time when the first pulsed laser is irradiated with. An output of the first pulsed laser is arranged here so as to exceed a threshold value W1 at which the semiconductor melts. In addition, a laser output is adjusted so that the sum of the first pulsed laser and the second pulsed laser will be W0. Furthermore, it is possible to continue a molten state of a semiconductor film longer by making a pulse width of the first pulsed laser beam shorter than that of the second pulsed laser beam.

A pulse width of a pulsed laser absorbed well into a semiconductor film of a solid-phase state is several hundreds nsec; therefore, the semiconductor film is momentarily melted and recrystallized to form a ridge. However, a pulsed laser with a fundamental wave having a pulse width of some tens μsec or more can be used; therefore, a molten state is continued longer for more than some hundred times. It will be difficult for the ridge formed on a surface of a semiconductor film to maintain its shape since melted time will be remarkably longer. Therefore, it is possible to control a ridge formation, and an advantageous effect that the present invention expects can be obtained.

Note that, as shown in FIG. 1B, the invention may be in a constitution that the first pulsed laser is irradiated for a plurality of times within time when the second pulsed laser is irradiated by choosing a condition of laser. In addition, the invention may be also in a constitution that irradiates the one (in this specification, referred to as a pulsed oscillation) modulated a CW laser into a pulsed shape. It will be possible to control the ridge on the semiconductor film by carrying out laser irradiation according to the above method.

One of constitution regarding a method of laser irradiation disclosed in this specification is a method of laser irradiation comprising the steps of: overlapping an area which is irradiated with a first laser beam of a pulsed oscillation having a wavelength of at most visible light with an area which is irradiated with a second laser beam of a pulsed oscillation having a longer wavelength (or a fundamental wave) than that of the first laser beam; and irradiating a subject to be irradiated with the first laser beam and the second laser beam while synchronizing the pulsed oscillation of the first laser beam with that of the second laser beam, and moving the subject to be irradiated, and the first laser beam and the second laser beam relatively each other.

One of constitution regarding a method of laser irradiation disclosed in this specification is a method of laser irradiation comprising the steps of: overlapping a first laser beam of a pulsed oscillation which melts a semiconductor film with a second laser beam of a pulsed oscillation which an absorption coefficient $\alpha$ with respect to a molten state of the semiconductor film and an absorption coefficient $\beta$ with respect to a solid state of the semiconductor film satisfy an inequality of $\alpha \geq 10\beta$; and irradiating a subject to be irradiated with the first laser beam and the second laser beam while synchronizing the pulsed oscillation of the first laser beam with that of the second laser beam, and moving the semiconductor film, and the first laser beam and the second laser beam relatively each other.

One of constitution regarding a method of laser irradiation disclosed in this specification is a method of laser irradiation, comprising the steps of: overlapping a first laser beam of a pulsed oscillation having a wavelength range of which an absorption coefficient with respect to a solid state of a semiconductor film is $5 \times 10^3$ or more, a second laser beam of a pulsed oscillation having a wavelength range of which an absorption coefficient with respect to a solid state of the semiconductor film is $5 \times 10^2$/cm or less and an absorption coefficient with respect to a molten state of the semiconductor film is $5 \times 10^3$/cm or more; and irradiating a subject to be irradiated with the first laser beam and the second laser beam while synchronizing the pulsed oscillation of the first laser beam with that of the second laser beam, and relatively moving the semiconductor film, the first laser beam, and the second laser beam.

In the above constitution of the invention, the first laser beam is selected from the group consisting of: an Ar laser; a Kr laser; an excimer laser; a $CO_2$ laser; a YAG laser; a $Y_2O_3$ laser; a $YVO_4$ laser; a $GdVO_4$ laser; a YLF laser; a $YAlO_3$ laser; a glass laser; a ruby laser; an alexandrite laser; a Ti: sapphire laser; a copper vapor laser; and a gold vapor laser.

In addition, in the above constitution of the invention, the second laser beam is selected from the group consisting of: a $CO_2$ laser; a YAG laser; a $Y_2O_3$ laser; a $YVO_4$ laser; a $GdVO_4$ laser; a YLF laser; a $YAlO_3$ laser; a glass laser; an alexandrite laser; and a Ti: sapphire laser.

Furthermore, in the above constitution of the invention, the first laser beam is converted to a harmonic by a nonlinear optical element so as to be visible light. However, a fundamental wave that is already below visible light may be used as it is. As a crystal used for the nonlinear optical element, crystal such as LBO, BBO, KDP, KTP, KB5 and CLBO are superior in terms of conversion efficiency. A conversion efficiency can be raised greatly by putting these nonlinear optical element into a laser resonator.

One of the constitutions of the invention regarding a laser irradiation device disclosed in this specification is a laser irradiation device comprising: a first laser oscillator of a pulsed oscillation which outputs a wavelength of equal to or shorter than that of visible light; a second laser oscillator of a pulsed oscillation which outputs a longer wavelength (a fundamental wave) than that of a first laser beam; means for emitting the second laser beam which is emitted from the second laser oscillator so as to be overlapped with an area which is irradiated with the first laser beam which is emitted from the first laser oscillator; means for moving a subject to be irradiated, and the first laser beam and the second laser beam relatively each other; and means for synchronizing a pulse period of the first laser oscillator with a pulse period of the second laser oscillator.

Other constitutions of the invention regarding a laser irradiation device disclosed in this specification is a laser irradiation device comprising: a first laser oscillator of a pulsed oscillation which outputs a wavelength of equal to or shorter than that of visible light; a second laser oscillator of a pulsed oscillation which outputs a longer wavelength (or a fundamental wave) than that of a first laser beam; means for processing a first laser beam emitted from the first laser oscillator and a second laser beam emitted from the second laser oscillator into linear beams; means for emitting the second laser beam which is emitted from the second laser oscillator so as to be overlapped with an area which is irradiated with the first laser beam which is emitted from the first laser oscillator; means for moving an irradiated surface, and the first laser beam and the second laser beam relatively each other; and means for synchronizing a pulse period of the first laser oscillator with a pulse period of the second laser oscillator.

In the above constitution of the invention, the first laser oscillator is selected from the group consisting of: an Ar laser; a Kr laser; an excimer laser; a $CO_2$ laser; a YAG laser; a $Y_2O_3$ laser; a $YVO_4$ laser; a $GdVO_4$ laser; a YLF laser; a $YAlO_3$ laser; a glass laser; a ruby laser; an alexandrite laser; a Ti: sapphire laser; a copper vapor laser; and a gold vapor laser.

In the above constitution of the invention, the second laser oscillator is selected from the group consisting of: a $CO_2$ laser; a YAG laser; a $Y_2O_3$ laser; a $YVO_4$ laser; a $GdVO_4$ laser; a YLF laser; a $YAlO_3$ laser; a glass laser; an alexandrite laser; and a Ti: sapphire laser.

One of the constitutions of the invention regarding a method for manufacturing a semiconductor device disclosed in this specification is a method for manufacturing a semiconductor device comprising the steps of: forming an amorphous semiconductor film; forming the crystalline semiconductor film by irradiating the amorphous semiconductor film with a laser beam; patterning the crystalline semiconductor film; and forming a channel formation region including at least a part of a patterned crystalline semiconductor film, wherein an area which is irradiated with a first laser beam of a pulsed oscillation having a wavelength of equal to or shorter than that of visible light is overlapped with an area which is irradiated with a second laser beam of a pulsed oscillation having a longer wavelength (or a fundamental wave) than that of the first laser beam; and the crystalline semiconductor film is formed by emitting the first laser beam and the second laser beam while synchronizing the pulsed oscillation of the first laser beam with that of the second laser beam, and moving the amorphous semiconductor film, and the first laser beam and the second laser beam relatively each other.

One of the constitutions of the invention regarding a method for manufacturing a semiconductor device disclosed in this specification is a method for manufacturing a semiconductor device comprising the steps of: forming an amorphous semiconductor film; forming the crystalline semiconductor film by irradiating the amorphous semiconductor film with a laser beam; patterning the crystalline semiconductor film; and forming a channel formation region including at least part of a patterned crystalline semiconductor film, wherein a first laser beam of a pulsed oscillation which melts a semiconductor film is overlapped with a second laser beam of a pulsed oscillation in which an absorption coefficient $\alpha$ with respect to a molten state of the semiconductor film and an absorption coefficient β with respect to a solid state of the semiconductor film satisfy an inequality of $\alpha \geq 10\beta$; and the crystalline semiconductor film is formed by emitting the first laser beam and the second laser beam while synchronizing the pulsed oscillation of the first laser beam with that of the second laser beam, and moving the amorphous semiconductor film, and the first laser beam and the second laser beam relatively each other.

Other constitutions of the invention regarding a method for manufacturing a semiconductor device disclosed in this specification is a method for manufacturing a semiconductor device comprising the steps of: forming an amorphous semiconductor film; forming the crystalline semiconductor film by irradiating the amorphous semiconductor film with a laser beam; patterning the crystalline semiconductor film; and forming a channel formation region including at least a part of a patterned crystalline semiconductor film, wherein a first laser beam of a pulsed oscillation having a wavelength range of which an absorption coefficient with respect to a solid state of a semiconductor film is $5 \times 10^3$/cm or more is overlapped, a second laser beam of a pulsed oscillation having a wavelength range of which an absorption coefficient with respect to a solid state of the semiconductor film is $5 \times 10^2$/cm or less and an absorption coefficient with respect to a molten state of the semiconductor film is $5 \times 10^3$/cm or more; and the crystalline semiconductor film is formed by emitting the first laser beam and the second laser beam while synchronizing the pulsed oscillation of the first laser beam with that of the second laser beam, and moving the amorphous semiconductor film, and the first laser beam and the second laser beam relatively each other.

In the above constitution of the invention, the first laser beam is emitted from a laser selected from the group consisting of: an Ar laser; a Kr laser; an excimer laser; a $CO_2$ laser; a YAG laser; a $Y_2O_3$ laser; a $YVO_4$ laser; a $GdVO_4$ laser; a YLF laser; a $YAlO_3$ laser; a glass laser; a ruby laser; an alexandrite laser; a Ti: sapphire laser; a copper vapor laser; and a gold vapor laser.

In the above constitution of the invention, the second laser beam is selected from the group consisting of: a $CO_2$ laser; a YAG laser; a $Y_2O_3$ laser; a $YVO_4$ laser; a $GdVO_4$ laser; a YLF laser; a $YAlO_3$ laser; a glass laser; an alexandrite laser; and a Ti: sapphire laser.

In addition, as a substrate on which an amorphous semiconductor is formed, a glass substrate, a quartz substrate or a silicon substrate, a plastic substrate, a metal substrate, a stainless substrate, a flexible substrate, or the like are used. As the glass substrate, there is a substrate made of a glass such as a barium boro-silicated glass or an aluminum boro-silicated glass. The flexible substrate refers to a substrate in a filmed shape made of PET, PES, PEN, acryl, and light weighting can be expected as a semiconductor device is manufactured by using a flexible substrate. It is desirable to form a barrier layer such as an aluminum film (for example, AlON, AlN, or AlO), a carbon film (such as a DLC (diamond-like carbon) film), or a SiN film in a single-layer structure or a multilayer structure over a surface of the flexible substrate or over the surface and a rear surface thereof since the property such as durability is enhanced. Note that, an inequality regarding φ described hereinafter cannot be applied in besides a substrate that is transparent to a laser beam since, in this case, a thickness d of the substrate takes a nonsense value.

When the annealing is performed to a semiconductor film formed over a substrate transparent to a laser beam, in order to realize uniform irradiation of the laser beam, it is desirable that an incidence angle of φ the laser beam satisfies the inequality of $\phi \geq \arctan(W/2d)$. In the inequality, it is defined that an incidence plane is perpendicular to the surface to be irradiated and includes a longer side or a shorter side of the laser beam assuming that a shape of the laser beam is rectangular. Moreover, in the inequality, "W" is a length of the longer side or the shorter side included in the incidence plane and "d" is a thickness of the substrate transparent to the laser beam, which is placed on the surface to be irradiated. Note that, let an incident angle of the track that is projected into the irradiated surface be "φ" when there is no track of the laser beam on the incidence surface. As a laser beam is made incident with this incident angle, reflected light on the surface of a substrate and reflected light from the rear surface of the substrate do not interfere, which can carry out uniform irradiation of a laser beam. In addition, when a plurality of laser beams is used, the above inequality needs to be satisfied for each laser beam.

A refractive index of the substrate is considered as 1 in the above discussion. Actually, a refractive index of the substrate is often thereabout 1.5, which can obtain a larger calculated value than an incident angle calculated in the above discussion, taking this value into consideration. However, energy of a beam spot is attenuated toward the edge, at which the effect of the interference is little; therefore, an advantageous effect of interference decrease can be obtained enough with the above calculated value. In addition, the equality is applicable for the first and the second laser beam and it is preferable to have both beams satisfy the above inequality; however, it is not problematic for a laser with an extremely short coherence length such as an excimer laser not to satisfy the above inequality.

In the invention, the semiconductor film that is an irradiated surface is synchronized with a pulsed laser having a wavelength of equal to or shorter than that of visible light, and a fundamental wave of a pulsed oscillation with a wavelength of about 1 μm is emitted complementally. According to the above method, the fundamental wave is absorbed well into the semiconductor film melted in a large area, and melted time of the semiconductor film can be controlled. Furthermore, it is possible to decrease significantly a formation of a ridge on the surface of the semiconductor film compared to a conventional technique. Therefore, a film coating of a film formed on the semiconductor film is improved, and it is possible to form a TFT that an electrical characteristic, typified by mobility is extremely better. In addition, it is possible to manufacture a semiconductor device, typified by a high definition active matrix type liquid crystal display device and a light-emitting device. Then, it is possible to improve an operating characteristic and reliability of such semiconductor device.

BRIEF DESCRIPTION OF THE DRAWINGS

FIGS. 7A to 7C are drawings describing a step for manufacturing a TFT;

DETAILED DESCRIPTION OF THE PREFERRED EMBODIMENTS

Embodiment Mode 1

Figure 2:
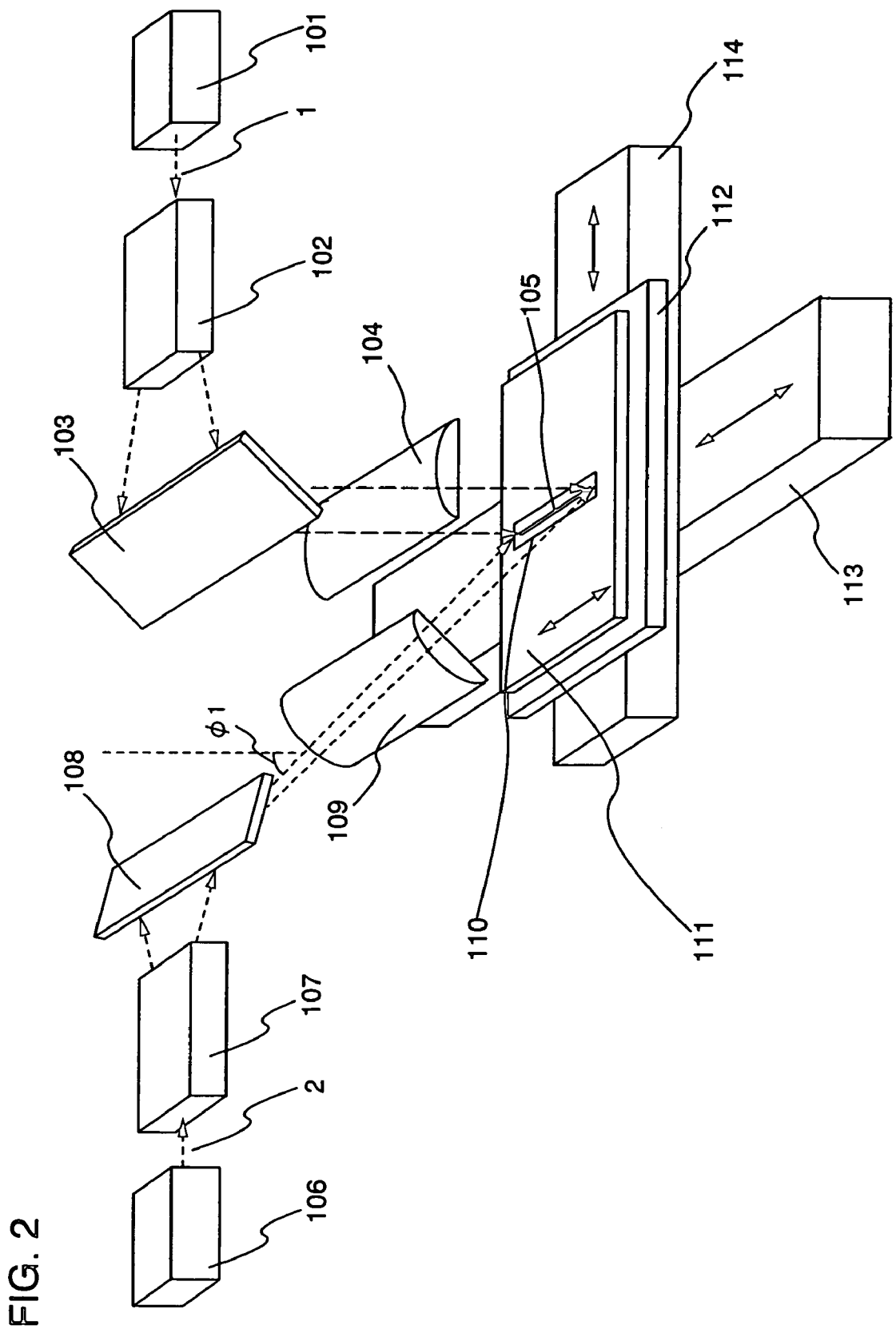
FIG. 2 is a drawing describing Embodiment Mode 1 of the invention.

Embodiment mode of the present invention is explained with reference to FIG. 2. In this embodiment mode, an example is shown, which forms a long beam 105 and a long beam 110 to irradiate an irradiated surface 111.

Initially, a laser oscillator 101 (for example, XeCl excimer laser) of 200 W in a pulsed oscillation is provided. A frequency is around 300 Hz, a pulse width is around 20 ns, and an oscillation wavelength is 308 nm. Note that, the laser oscillator has means for synchronizing a cycle of a pulse of other laser oscillators with pulsed frequency.

A beam spot of a first laser beam 1 emitted from the laser oscillator 101 is shaped by an optical system 102. The optical system 102 of the present device is described here. As for the first laser beam, an energy distribution of laser light is uniformed in an irradiated surface by transmitting a homogenizer composed of the optical system 102 including a cylindrical lens array which is not shown in the figure and a cylindrical lens 104. A mirror 103 is interposed in the middle of the homogenizer, and a traveling direction of the laser beam is changed. A linear beam can be focused over a substrate to be treated by transmitting the first laser beam to the cylindrical lens 104. That is, the optical system 102 and the cylindrical lens 104 correspond to means for processing the first laser beam into a linear beam. Note that, a linear beam can be processed by providing a plurality of cylindrical lenses and even by combining a convex lens and a concave lens. According to the above method, a beam of laser light just before entering into the optical system 102 is a rectangle having a size of around 3×2 cm, and the irradiated surface 111 can be irradiated with the first linear beam (105) having a size of, for example, about 100 mm in length and 400 μm in width.

Next, a laser oscillator 106 (for example, a Nd:YAG laser, a fundamental wave, a frequency of 300 Hz, a pulse width of 0.2 msec) of 600 W in a pulsed oscillation is provided. Note that, the laser oscillator has means for synchronizing its pulsed frequency with a pulse cycle of other laser oscillators, especially with a first laser oscillator.

A beam spot of a second laser beam 2 emitted from the laser oscillator 106 is shaped by an optical system 107. The second laser beam uniforms an energy distribution of laser light by transmitting a homogenizer composed of the optical system 107 including a cylindrical lens array, a cylindrical lens 109, and the like. The traveling direction of the laser beam is changed that is deviated by an angle φ1 from a vertical direction by a mirror 108 interposed in the middle of the homogenizer. The cylindrical lens 109 can focus a laser beam in a linear shape on the irradiated surface 111. That is, the optical system 107 and the cylindrical lens 109 correspond to means for processing the second laser beam to a linear beam. Note that, a linear beam can be processed by providing a plurality of cylindrical lenses and even by combining a convex lens and a concave lens. According to the above method, laser light just before entering into the optical system 107 is a beam of around φ 10 mm, and the irradiated surface 111 can be irradiated with the second linear beam (110) of about 120 mm in length and 800 μm in width. The second linear beam is irradiated superposing the linear first beam thereover. This may be controlled by the mirrors 103 and 108. That is, the mirrors 103 and 108 correspond to means for irradiating the second beam emitted from the second laser oscillator so as to be superposed to a range where the first laser beam emitted from the first laser oscillator is irradiated. Note that, when coherence of the second laser beam emitted from the laser oscillator 106 is strong, a device is necessary, which makes an optical path difference in each of laser beams split by the homogenizer.

A semiconductor film is provided in parallel with a horizontal surface as the subject to be irradiated 111. The semiconductor film is formed over, for example, a surface of a glass substrate. A substrate on which the semiconductor film is formed is a glass substrate with a thickness of 0.7 mm in this embodiment, and it is fixed to an absorption stage 112 so that the substrate does not fall off at the time of laser irradiation. The absorption stage 112 can move on a surface parallel to the semiconductor surface 111 into an X, Y-direction by one shaft robot 113 for a X-axis and one shaft robot 114 for a Y-axis. That is, as means for moving the subject to be treated, and the first laser beam and the second laser beam relatively each other, the one shaft robot 113 for X-axis and the one shaft robot 114 for Y-axis, and the absorption stage 112 are corresponded.

Generally, a glass substrate is transparent to a fundamental wave such as a YAG laser and the like with a wavelength of around 1 μm and to a green second harmonic such as a YAG laser. The position of the cylindrical lens 109 is moved to a vertical direction to the incidence surface so as to have an incidence angle within the surface vertical to the irradiated surface including a minor axis of longer laser beam to satisfy an inequality so that the present optical system satisfies an inequality of the above. In this case, interference can be controlled as there is an angle of around 30° in the second longer laser beam. That is, letting a thickness of a substrate that is transparent to laser light be "d", the cylindrical lens 109 corresponds to means for controlling so that an incidence angle φ2 of the second laser beam satisfies an inequality of φ2≧arctan(W2/2d)(W2: a length of a shorter side and a longer side, regarding a shape of the second laser beam as a linear shape). Note that, similarly, the cylindrical lens 104 corresponds to means for controlling so that an incidence angle φ1 of the first laser beam satisfies an inequality of φ1≧arctan(W1/2d) (W1: a length of a narrow side and a wide side as regarding a shape of the first laser beam as a linear shape).

Figure 1A:
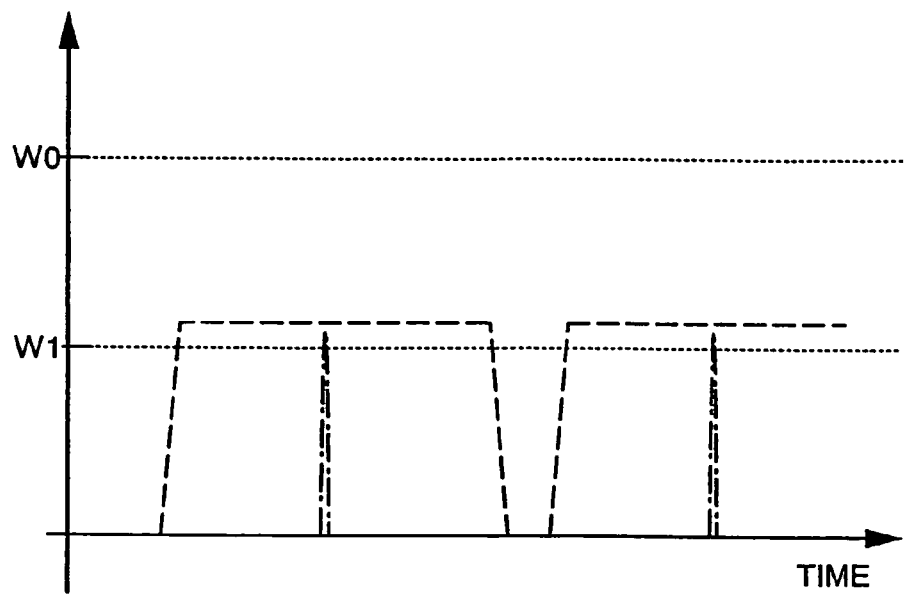
FIGS. 1A and 1B are drawings describing time change of laser output of a laser oscillator that is characterized by the present invention.
Figure 1B:
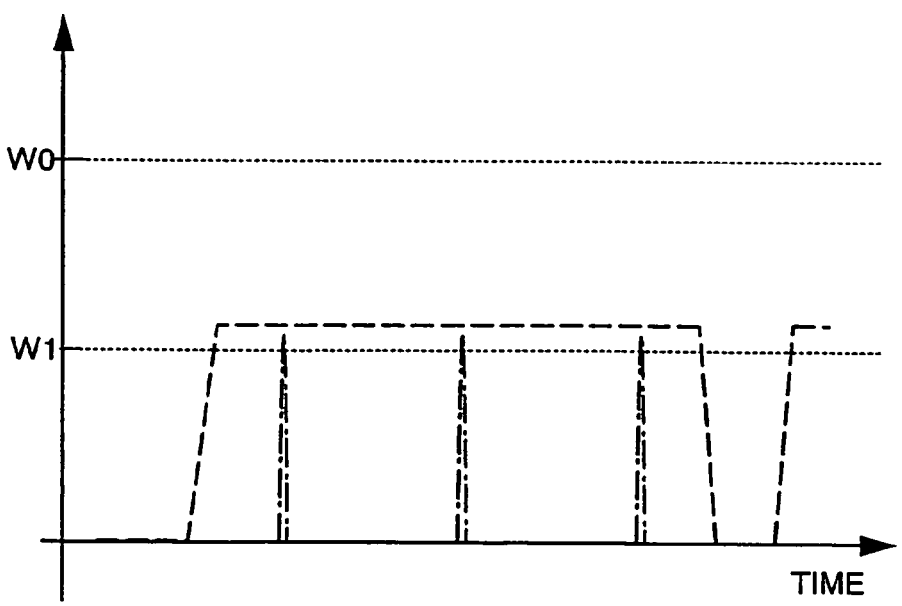

Next, a method for oscillating the laser oscillator 101 and the laser oscillator 106 is explained. Timing of an oscillation is as described in FIG. 1. First, the semiconductor film is melted by the laser beam emitted from the laser oscillator 101, and the laser beam emitted from the laser oscillator 106 of a fundamental wave is emitted while this molten state is maintained. Laser irradiation is carried out by arranging the pulsed width and the output so that a molten state of a semiconductor film can be continued and a formation of ridge can be prevented. This output is influenced by physical properties of a semiconductor film, scanning speed of a laser beam, or the like; however, there is a high possibility that appropriate energy can be chosen within a range of about 50 kW/cm to 500 MW/cm$^2$. As expressed in FIG. 1, it will be as FIG. 1A. In FIG. 1A, letting a laser output appropriate in this step be "W0", an output of the laser oscillator 101 is equal to or lower than "W0", which is complemented with an output of the laser oscillator 106 of a fundamental wave, and it may be set so as to be output of W0 in sum. It is possible to continue a molten state of a semiconductor film by lengthening time width of a pulse emitted from the laser oscillator 106 longer than time width of a pulse emitted from the laser oscillator 101. A semiconductor film can be crystallized while controlling a ridge formation by repeating such a pulsed oscillation.

Next, an example of a method for manufacturing a semiconductor film is shown. The semiconductor film is formed over a glass substrate. Specifically, a silicon oxynitride film with a thickness of 200 nm is formed on one side of a glass substrate with a thickness 0.7 mm, and an amorphous semiconductor film (a-Si film) with a thickness of 70 nm is formed thereon with plasma CVD. In order to further raise a resistivity with respect to a laser of a semiconductor film, a thermal annealing of 500° C. is carried out for one hour on the semiconductor film. Besides the thermal annealing, crystallization of a semiconductor film by a metal element may be also carried out. Whether using either of films, an appropriate irradiation condition for the laser beam is almost the same.

Thereafter, an example of irradiating a laser with respect to the semiconductor film (corresponding to the irradiated surface 111) is shown. A laser annealing is carried out on the entire of a semiconductor film by scanning a substrate which the semiconductor film is formed in the direction of minor axis of the longer beam 105 using the Y-axis robot 114. Then, an output of a laser oscillator is changed in a pattern shown in FIG. 1. In the scanning, after the semiconductor film is irradiated with an excimer laser and the semiconductor film is in a molten state, a YAG laser affects the molten region.

Figure 4:
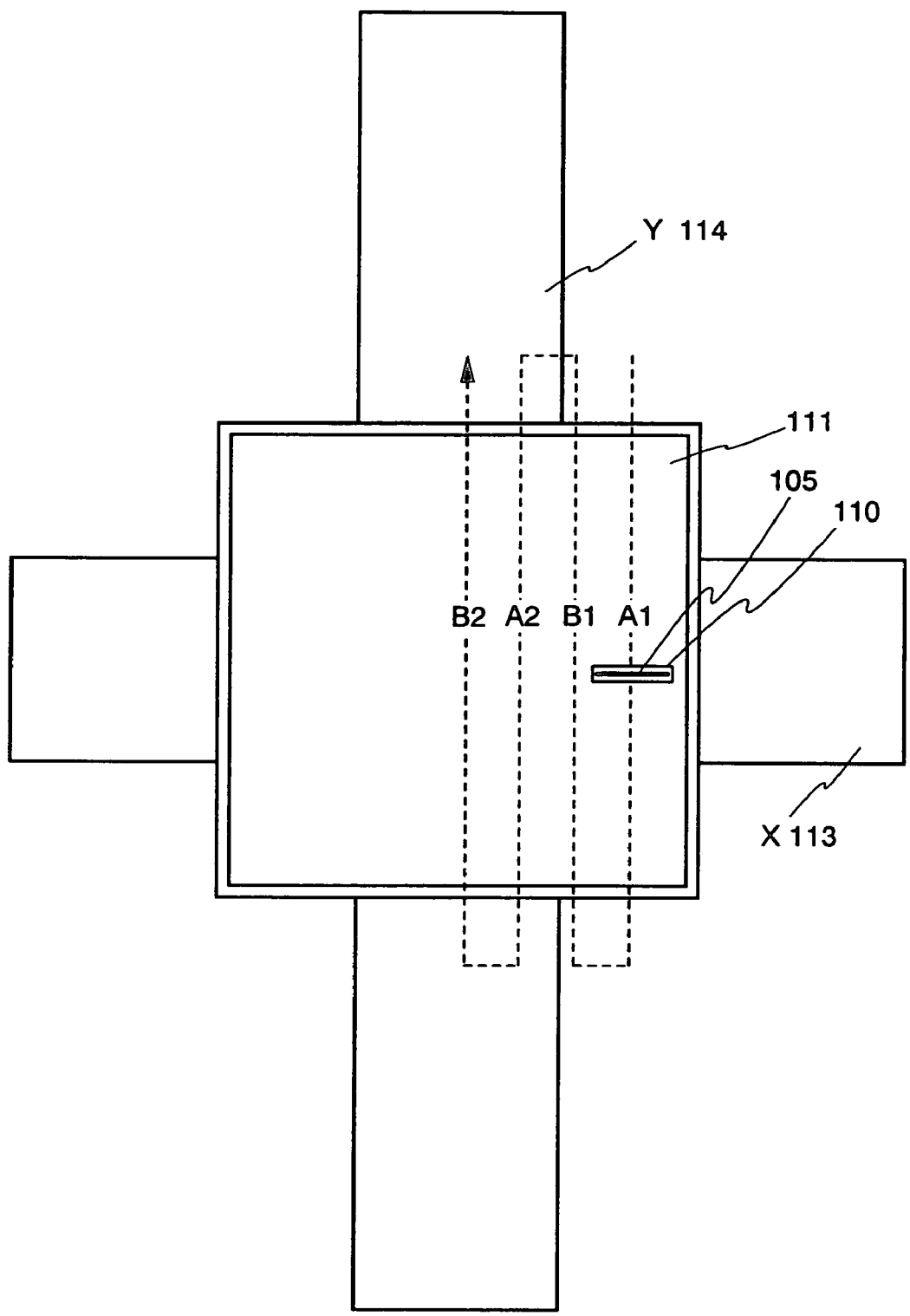
FIG. 4 is a drawing showing an example of a method for irradiating an entire surface of a semiconductor film with a laser beam.

In FIG. 4, an irradiation method of carrying out a laser annealing on an entire surface of a semiconductor film is shown. The same components are denoted by the same numerals as that of FIG. 1 to facilitate an identification. The substrate on which a semiconductor film is layered is fixed to the absorption stage 112, and the laser oscillator 101 and laser oscillator 106 are oscillated. At first, the semiconductor film surface is scanned in a line by the Y-axis robot 114 in a scanning speed of 1 cm/s. One ray corresponds to part of A1 in FIG. 4. In FIG. 4, after irradiating an approach route Am (m is a positive integer) with a laser using the Y-axis robot, a beam is slid by the X-axis robot 113 to the direction of major axis for the width of a region where a laser annealing is carried out, and a homeward Bm is irradiated with a laser. However, in the both ends at a direction of a width of the region that is annealed with a laser and crystallized, a region is formed, where energy lacks in anyway; therefore, an usage efficiency of a semiconductor film will be the highest and preferable as the outward and the homeward are superposed. In addition, it is vital not to form a semiconductor element called for a high characteristic in the region. A laser annealing can be carried out on an entire surface of the semiconductor film by repeating such a series of operation.

A semiconductor device is manufactured by using the semiconductor film that is obtained according to the above method. An example of a method for manufacturing a semiconductor device is shown in embodiments.

Embodiment Mode 2

In this embodiment, an example of irradiating a semiconductor film with a laser using a plurality of laser oscillators that outputs a fundamental wave is shown taking along FIG. 3.

Figure 3A:
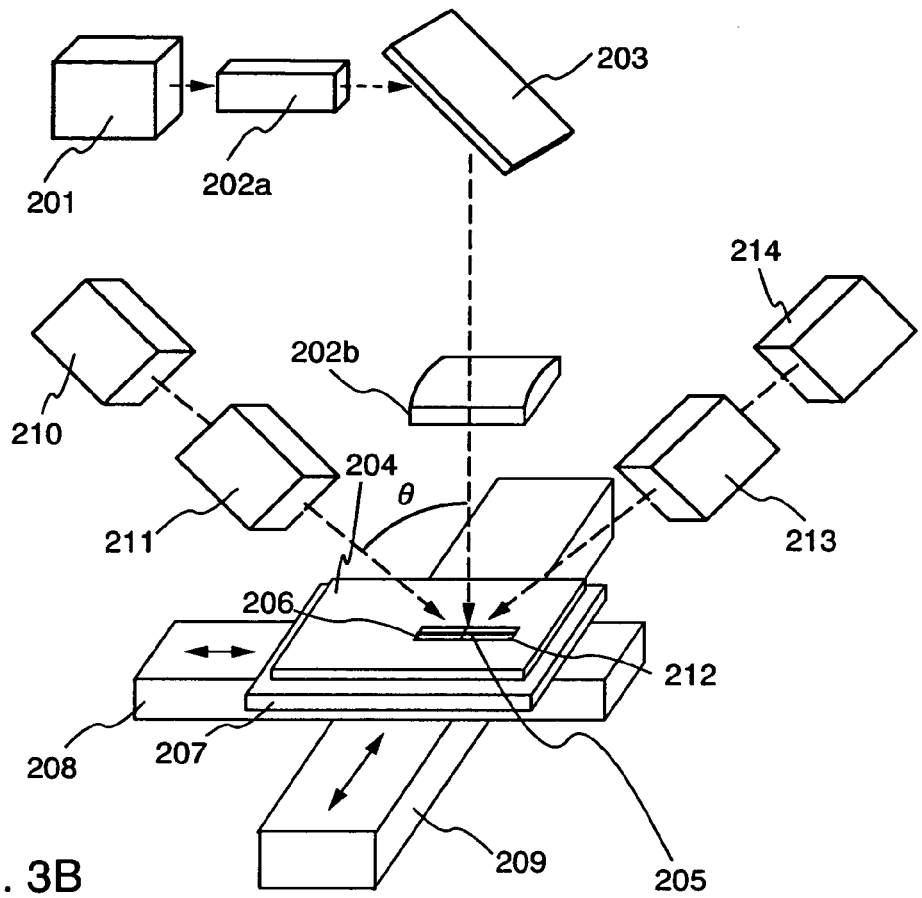
FIGS. 3A and 3B are drawings describing Embodiment 2 of the invention.
Figure 3B:
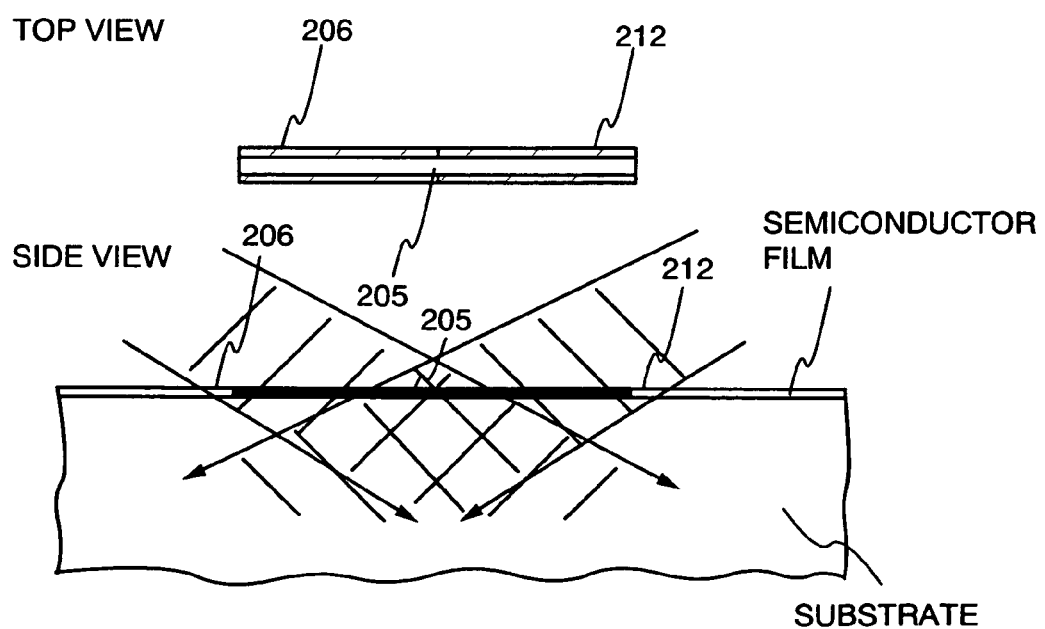

At first, as shown in FIG. 3A, a laser oscillator 201 (for example, XeCl excimer laser, a wavelength of 308 nm, a pulse width of 20 ns) of 300 W in a pulsed oscillation is provided. The laser oscillator has a frequency of 300 Hz and can generate an output of 1 J per pulse. A beam size is processed into 200 mm×0.5 mm in length by a suitable optical systems 202a and 202b. A mirror 203 is interposed in the middle of the optical systems to change a traveling direction of a laser beam into a vertical direction. It is assumed that an energy distribution on an irradiated surface is uniform, and a homogenizer with, for example, a cylindrical lens array and a cylindrical lens combined therein is used for an optical system. Besides, an energy distribution may be uniformed using a light pipe and other integrated lens. When a semiconductor film is crystallized with an excimer laser, an appropriate energy density is broadly in the range of 200 to 1000 mJ/cm$^2$. Note that, in the caser of an excimer laser, it is not necessary to consider an incidence angle of a beam into a semiconductor film since a coherent length is very short.

Next, laser oscillators 210 and 214 (for example, a Nd: YAG laser, a pulsed oscillation, a fundamental wave, a frequency of 300 Hz, a pulse width of 0.2 msec) of 600 W are provided. Beam spots of laser beams emitted from the both laser oscillators are shaped by optical systems 211 and 213. A homogenizer with, for example, a cylindrical lens array and a cylindrical lens combined therein is used for an optical system. Besides, an energy distribution may be uniformed using a light pipe and other integrated lens. Note that, when coherence of a laser beam emitted from the laser oscillators 210 and 214 is strong, a device is necessary, which makes an optical path difference in each of a laser beams split by the homogenizers. The beam shaped by the optical system is preferably incident into the semiconductor film 204 at an incidence angle of 35° or more in order to prevent the interference on the semiconductor film. In this embodiment mode, letting the incidence angle be 35°, elliptical beams 206 and 212 having a size of around 100 mm×1 mm are formed on the semiconductor film. A longer beam 205 is disposed to be covered with the both of the beams 206 and 212. The beams are arranged as described in FIG. 3B in such a way that the beams 206 and 212 by a fundamental wave are disposed in the both sides of the direction of major axis of the longer beam 205, and that the direction of major axis each of the beams by a fundamental wave is arranged on one straight line.

After disposing the optical systems as described above, the semiconductor film 204 is irradiated with a laser. A method of irradiation is as shown in Embodiment Mode 1. However, in the case of this embodiment mode, this embodiment mode is especially effective for a semiconductor device which is more necessary to uniform a characteristic of a semiconductor element since an energy distribution of an excimer laser and an energy distribution of YAG laser are also relatively uniform in a molten region of the semiconductor film. A substrate on which the semiconductor film 204 is formed is provided to an absorption stage 207. By scanning a X-axis robot 208 and a Y-axis robot 209, it is possible to anneal the entire surface of the semiconductor film.

A semiconductor device is manufactured using the semiconductor film that is obtained according to the above method. An example of a method for manufacturing the semiconductor device is shown in embodiments.

Embodiment 1

Figure 5A:
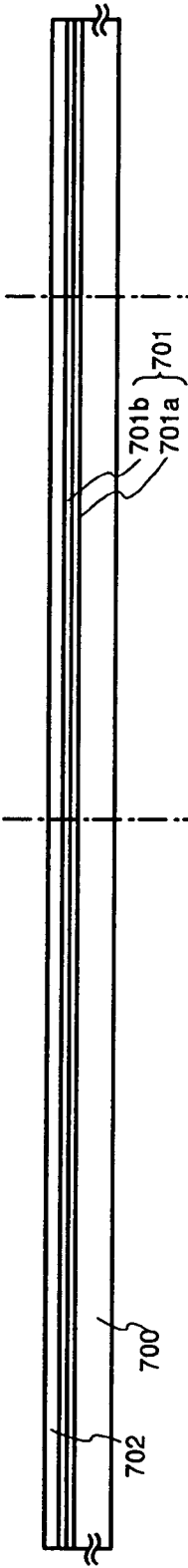
FIGS. 5A to 5C are drawings describing a step for manufacturing a TFT.

In this embodiment, an example of a method for manufacturing an active matrix substrate using the semiconductor film shown an example of a manufacturing method in the above embodiment mode is described with reference to FIG. 5 and FIG. 6.

At first, in this embodiment, a substrate 700 composed of a barium borosilicate glass, typical example of #7059 glass or #1737 glass of Corning Corp., or an aluminum borosilicate glass is used. Note that, a quartz substrate, a silicon substrate, a metal substrate, or a stainless substrate, on which an insulating film is formed can be also used as the substrate 700. In addition, a plastic substrate having a heat resistance that can resist to a processing temperature of this embodiment may be used.

Next, a base film 701 composed of an insulating film such as a silicon oxide film, a silicon nitride film, or a silicon oxynitride film is formed on the substrate 700. In this embodiment, a double-layered structure is used for the base film 701; however, a single-layered film of the insulating film or a multi-layered structure of two or more layers may be used. A silicon oxynitride film 701a that used $SiH_4$, $NH_3$, and $N_2O$ as a reactive gas is formed for 10 to 200 nm (preferably, 50 to 100 nm) as a first layer of the base film 701 using plasma CVD. In this embodiment, the silicon oxynitride film 701a (composition ratio: Si=32%, O=27%, N=24%, H=17%) with a film thickness of 50 nm is formed. Next, a silicon oxynitride film 701b that $SiH_4$ and $N_2O$ are used as a reactive gas is layered in a thickness of 50 to 200 nm (preferably, 100 to 150 nm) as a second layer of the base film 701 using plasma CVD. In this embodiment, the silicon oxynitride film 701b (composition ratio: Si=32%, O=59%, N=7%; H=2%) with a film thickness of 100 nm is formed.

Next, a semiconductor film 702 is formed on the base film. A semiconductor film having an amorphous structure is formed as the semiconductor film 702 in a thickness of 25 to 80 nm by sputtering, LPCVD, or plasma CVD. There is no limit to material of the semiconductor film; however, the semiconductor film may be preferably formed of silicon or silicon germanium (SiGe) alloy. Then, semiconductor layers 802 to 806 are formed by patterning the crystalline semiconductor film that is obtained by carrying out a laser crystallization into the desired shape. Of course, other crystallization treatment (the heat crystallization which used RTA or an annealing furnace, heat crystallization using metal such as nickel, and the like) may be combined with, besides the laser crystallization.

A laser irradiation device having the optical system of the present invention is used to manufacture a crystalline semiconductor film with a laser crystallization. The semiconductor film is irradiated with a laser beam by collecting thereof in a linear shape (a rectangular shape or a ellipse shape) with the optical system. Note that, a condition for the crystallization is appropriately selected by a person executing this embodiment.

In this embodiment, the amorphous silicon film having a thickness of 66 nm is formed using plasma CVD. Then, the crystalline silicon film is formed by, for example, a laser crystallization using a fundamental wave of a YAG laser with a pulsed oscillation and an excimer laser that is shown in the invention. Thereafter, the semiconductor layers 802 to 806 are formed by a patterning treatment using photolithography based on the crystalline silicon film.

After forming the semiconductor layers 802 to 806, a trace amount of an impurity element (Boron or Phosphorus) may be doped to control a threshold value of a TFT.

Next, a gate insulating film 807 that coats the semiconductor layers 802 to 806 are formed. The gate insulating film 807 is formed in a thickness of 40 to 150 nm with an insulating film containing silicon using plasma CVD or sputtering. In this embodiment, a silicon oxynitride film (composition ratio: Si=32%, O=59%, N=7%, H=2%) is formed in a thickness of 110 nm by plasma CVD. Of course, the gate insulating film is not limited to a silicon oxynitride film, and other insulating film containing silicon may be used as a single-layered or multi-layered structure.

In addition, in a case of using a silicon oxide film, the silicon oxide film can be formed by plasma CVD. More specifically, the silicon oxide film can be formed by mixing TEOS (Tetraethyl Orthosilicate) with $O_2$, taking reaction pressure as 40 Pa, and a substrate temperature as 300 to 400° C., and allowing discharge to be conducted at a high-frequency (13.56 MHz) power density of 0.5 to 0.8 W/cm$^2$. The silicon oxide nitride film thus manufactured can obtain satisfactory characteristics as a gate insulating film by a thermal annealing of 400 to 500° C. carried out thereafter.

Figure 5B:
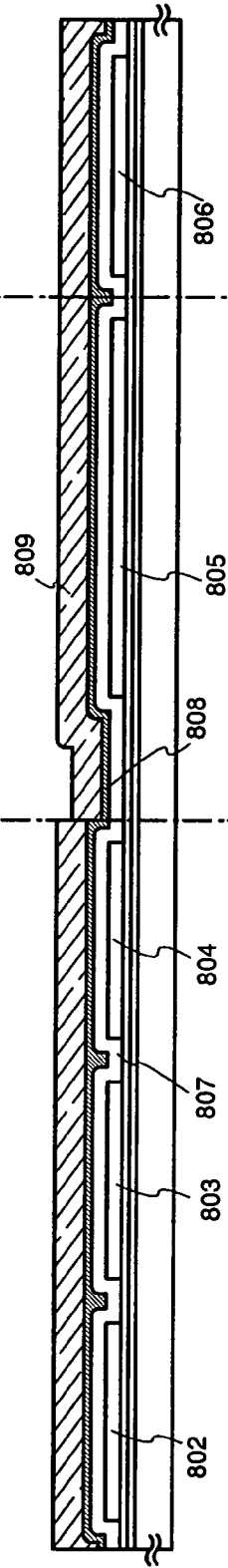
Figure 5C:
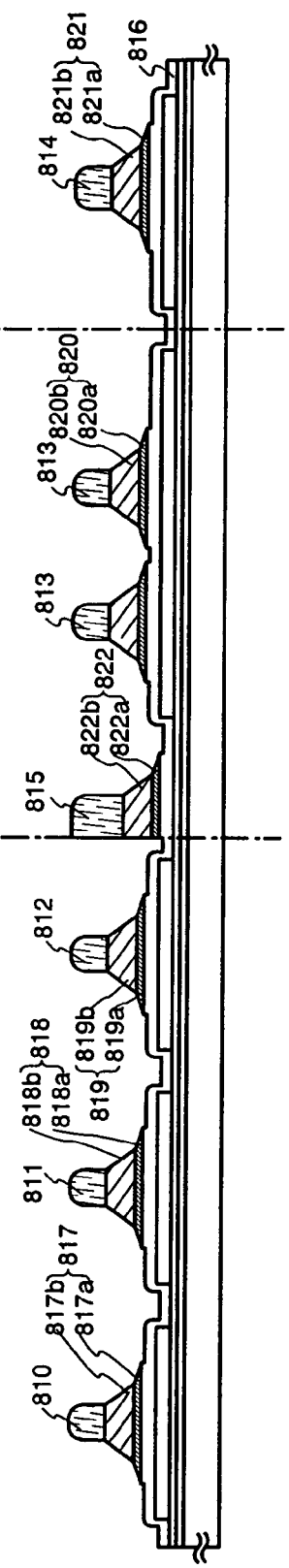

Next, as shown in FIG. 5B, a first conductive film 808 with a film thickness of 20 to 100 nm and a second conductive film 809 with a film thickness of 100 to 400 nm are layered on the gate insulating film 807. In this embodiment, the first conductive film 808 composed of a TaN film with a film thickness of 30 nm and the second conductive film 809 composed of a W film with a film thickness of 370 nm are layered. The TaN film is formed by sputtering, and sputtering is carried out within an atmosphere including nitrogen using a target of Ta. In addition, the W film is formed by sputtering using a target of W. Furthermore, the W film can be formed by thermal CVD using six tungsten fluoride ($WF_6$). In either case, it is necessary to reduce the resistance to use as a gate electrode, and it is desirable that let resistivity of the W film be 20 μΩcm or less. The W film can reduce the resistance by enlarging its crystal grain; however, when there is much impurity element such as oxygen, crystallization is obstructed within the W film, which induces high resistivity. Therefore, this embodiment can realize resistivity of 9 to 20 μΩcm under sputtering using a target of the W (purity of 99.9999%) in a high purity and further by forming the W film considering enough that an impurity within gas phases is not mixed during a film formation.

Note that, in this embodiment, let the first conductive film 808 be TaN and the second conductive film 809 be "W"; however, there is no particular limit thereto. As the both films, a element selected from Ta, W, Ti, Mo, Al, Cu, Cr, Nd or alloy material or compound material mainly containing the element may be also formed. In addition, a semiconductor film, typified by a crystalline silicon film which is doped with an impurity element such as phosphorus may be used. Furthermore, an AgPdCu alloy may be also used. Moreover, the combination that the first conductive film is formed with a tantalum (Ta) film and the second conductive film formed with a W film, the combination that the first conductive film is formed with a titanium nitride (TiN) film and the second conductive film is formed with a W film, the combination that the first conductive film is formed with a tantalum nitride (TaN) film and the second conductive film is formed with an Al film, and the combination that the first conductive film is formed with a tantalum nitride (TaN) film and the second conductive film is formed with a Cu film may also be applied.

Next, resist masks 810 to 815 are formed by photolithography to carry out a first etching treatment to form an electrode and a wiring. The first etching treatment is carried out under first and second etching condition. In this embodiment, as the first etching condition, an ICP (Inductively Coupled Plasma) etching is used. More specifically, etching is carried out, using $CF_4$, $Cl_2$, and $O_2$ as etching gas in each gas flow of 25:25:10 (sccm) and with RF (13.56 MHz) power of 500 W supplied to a coil-shaped electrode under pressure of 1 Pa to generate plasma. Herein, a dry etching device (Model E645-□ICP) using ICP produced by Matsushita Electric Industrial Co., Ltd. is used. RF (13.56 MHz) power of 150 W is also supplied to a substrate side (sample stage), whereby a substantially negative self-bias voltage is applied thereto. Under the first etching condition, the W film is etched to taper the edges of the first conductive layer.

Thereafter, the etching condition is changed to the second etching condition without removing the resist masks 810 to 815. Under the second etching condition, etching is carried out for about 30 seconds using $CF_4$ and $Cl_2$ as an etching gas in each gas flow of 30:30 (sccm) and with an RF (13.56 MHz) power of 500 W is also applied to a coil-shaped electrode under a pressure of 1 Pa to generate plasma. RF (13.56 MHz) power of 20 W is also supplied to a substrate side (sample stage), whereby a substantially negative self-bias voltage is applied thereto. Under the second etching condition mixed $CF_4$ and $Cl_2$, the W film and the TaN film are etched similarly. Note that, in order to carry out etching without leaving a residue on a gate insulating film, it is preferable that an etching time may be increased by about 10 to 20%.

In the above first etching treatment, the edges of the first conductive layer and the second conductive layer are tapered due to the advantageous effect of a bias voltage applied to the substrate side by making appropriate the shape of the resist masks. The taper angle will be 15 to 45°. Accordingly, first-shaped conductive layers 817 to 822 (first conductive layers 817a to 822a and second conductive layers 817b to 822b) composed of the first conductive layer and the second conductive layer are formed by the first etching treatment. Reference numeral 816 denotes a gate insulating film. Regions of the gate insulating film 816 that is not covered with the first-shaped conductive layers 817 to 822 are etched for about 20 to 50 nm to form a thin region.

Figure 6A:
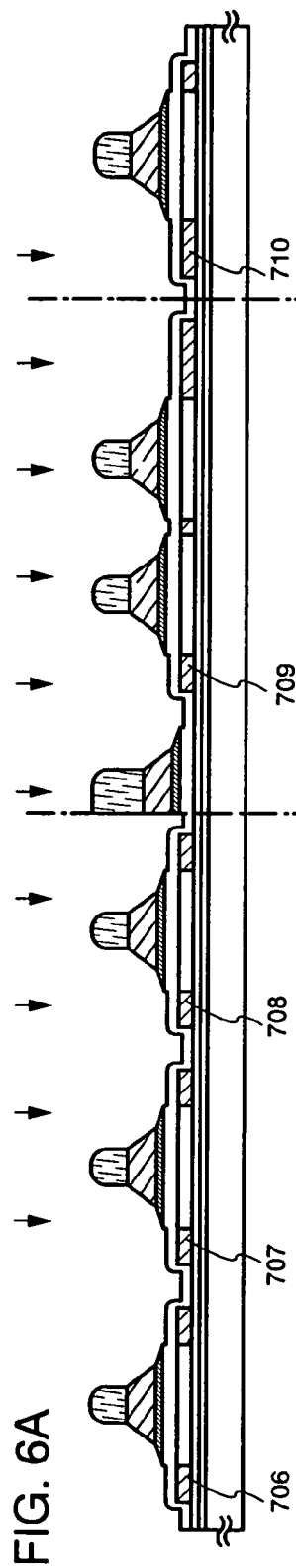
FIGS. 6A to 6C are drawings describing a step for manufacturing a TFT.

Then, a first doping treatment is carried out without removing the resist masks, whereby an impurity element imparting n-type is added to the semiconductor layers (FIG. 6A). The doping treatment may be carried out under ion doping or ion implantation. Ion doping is carried out under the condition of a dose amount of $1\times10^{13}$ to $5\times10^{5}/cm^2$ and an acceleration voltage of 60 to 100 keV. In this embodiment, ion doping is carried out under the condition of a dose amount of $1.5\times10^{15}/cm^2$ and an acceleration voltage of 80 keV. As an impurity element imparting n-type, an element belonging to Group 15, typically, phosphorus (P) or arsenic (As), is used, and phosphorus (P) is used here. In this case, the conductive layers 817 to 822 serve as masks with respect to the impurity element imparting n-type, and high-concentration impurity regions 706 to 710 are formed in a self-alignment manner. An impurity element imparting n-type is added to first high-concentration impurity regions 706 to 710 so as to have a concentration range of $1\times10^{20}$ to $1\times10^{21}/cm^3$.

Next, a second etching treatment is carried out without removing the resist masks. Herein, $CF_4$, $Cl_2$, and $O_2$ are used for etching gas and the W film is etched selectively. At this time, second conductive layers 828b to 833b are formed by the second etching treatment. On the other hand, the first conductive layers 817a to 822a are hardly etched and second-shaped conductive layers 828 to 833 including first layers 828a to 833a and second layers 828b to 833b are formed.

Figure 6B:
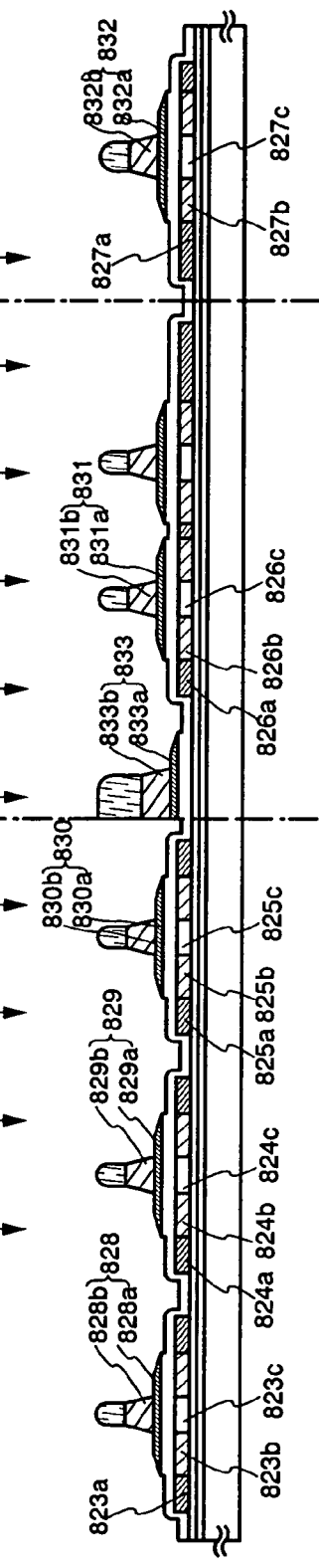

Next as shown in FIG. 6B, a second doping treatment is carried out without removing the resist masks. In this case, a dose amount is reduced than that of the first doping treatment, and impurity element imparting n-type is introduced under a high acceleration voltage of 70 to 120 keV. This embodiment is carried out taking a dose amount as $1.5\times10^{14}/cm^2$ and an acceleration voltage as 90 keV. The second doping treatment uses the second-shaped conductive layers 828 to 833 as masks and an impurity element is introduced also into the semiconductor layers in the lower part of the second conductive layers 828b to 833b to form newly second high-concentration impurity regions 823a to 827a, low-concentration impurity regions 823b to 827b, and channel regions 823c to 827c.

Figure 6C:
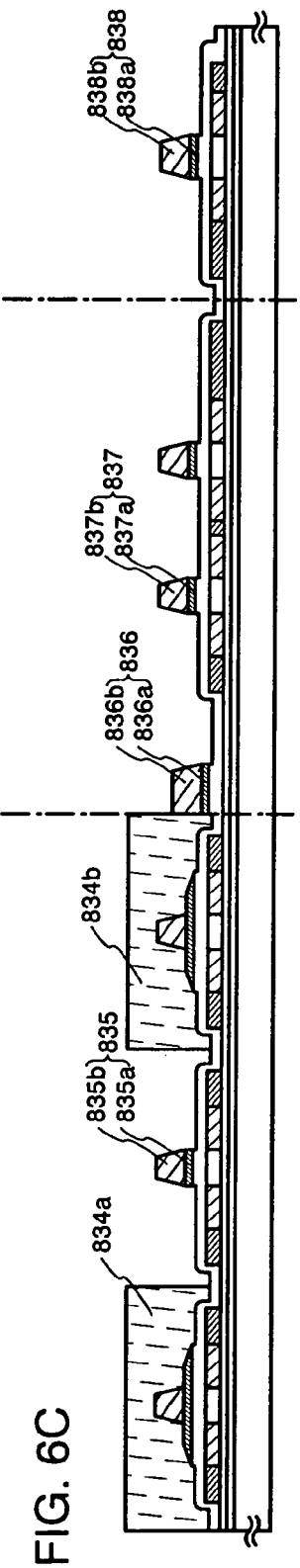

Next, after removing the resist masks, resist masks 834a and 834b are newly formed, and, a third etching treatment is carried out as shown in FIG. 6C. Etching treatment is carried out for about 30 seconds, using $SF_6$ and $Cl_2$ as etching gas in a gas flow of 50:10 and with RF (13.56 MHz) power of 500 W supplied to a coil-shaped electrode under pressure of 1.3 Pa to generate plasma. RF (13.56 MHz) power of 10 W is supplied to a substrate side (sample stage), whereby a substantially negative self-bias voltage is applied thereto. Accordingly, a p-channel type TFT and a TaN film of TFT (pixel TFT) in a pixel portion are etched by the third etching treatment to form third-shaped conductive layers 835 to 838 including first layers 835a to 838a and second layers 835b to 838b.

Next, after removing the resist masks, the second-shaped conductive layers 828, 830 and the third-shaped conductive layers 835 to 838 are used as the masks to form insulating layers 839 to 844 by selectively removing the gate insulating film 816. (FIG. 7A)

Next, resist masks 845a to 845c is newly formed, and a third doping treatment is carried out. Impurity regions 846 and 847, in which an impurity element imparting a conductivity type opposite to the one conductivity type is added, are formed in a semiconductor layer as to be active layers of p-channel type TFTs due to the third doping treatment. The third shape conductive layers 835 and 838 are used as the masks with respect to an impurity element, and an impurity element imparting p-type is added, whereby impurity regions are formed in a self-alignment manner. In this embodiment, the impurity elements 846 and 847 are formed by ion doping using diborane ($B_2H_6$) (FIG. 7B). During the third doping treatment, semiconductor layers forming n-channel type TFTs are coated with the resist masks 845a to 845c. Phosphorus is added to each of the impurity regions 846 and 847 in different concentrations due to the first and the second doping treatments. However, a doping treatment is carried out in the either regions so that the concentration of an impurity element imparting p-type will be $2\times10^{20}$ to $2\times10^{21}/cm^3$, whereby these regions function as a source region and a drain region of a p-channel type TFT. Therefore, there is no problem. In this embodiment, a part of the semiconductor layer as to be an active layer of p-channel type TFT is exposed; therefore, there is advantage that an impurity element (boron) is likely to be added.

Due to the above-mentioned steps, the impurity regions are formed in each semiconductor layer.

Then, a first interlayer insulating film 861 is formed by removing the resist masks 845a to 845c. The first interlayer insulating film 861 is formed with an insulating film containing silicon with a thickness of 100 to 200 nm using plasma CVD or sputtering. In this embodiment, a silicon oxynitride film with a film thickness of 150 nm is formed by plasma CVD. Of course, the first interlayer insulating film 861 is not limited to a silicon oxynitride film and other insulating film containing silicon may be used as a single-layer or a multi-layered structure of two or more layers.

Next, as shown in FIG. 7C, crystallinity of the semiconductor layers is recovered, and impurity element added to each semiconductor layer is activated by carrying out a heat treatment. This heat treatment is carried out by thermal annealing using a an annealing furnace. In the thermal annealing, it is carried out within nitrogen atmosphere with the oxygen concentration of 1 ppm or less, preferably 0.1 ppm or less at a temperature of 400 to 700° C., typically 500 to 550° C. In this embodiment, an activation treatment is carried out under a heat treatment at 550° C. for four hours. Note that, laser annealing or rapid thermal annealing (RTA) can be applied besides thermal annealing. A method shown in this embodiment mode may be adopted to laser annealing; however, it is necessary to note a condition since a gate and the like might be ablated due to some energy density that is given.

In addition, a heat treatment may be carried out before forming the first interlayer insulating film. However, when a wiring material to be used is weak to the heat, it is preferable that an activation treatment is carried out after the interlayer insulating film (insulating film mainly containing silicon, for example, silicon nitride film) is formed so as to protect a wiring and the like as in this embodiment.

Furthermore, a heat treatment is carried out at 300 to 550° C. for 1 to 12 hours within atmosphere containing 3 to 100% of hydrogen to carry out a step for hydrogenating the semiconductor layers. In this embodiment, a heat treatment is carried out at 410° C. within nitrogen atmosphere containing 3% of hydrogen. In this step, a dangling bond of the semiconductor layers are terminated due to hydrogen contained in the interlayer insulating film. As an alternative method of hydrogenation, plasma hydrogenation (using hydrogen excited by a plasma) may be also carried out.

Moreover, in using the conventional laser annealing as an activation treatment, it is desirable to emit a laser beam such as an excimer laser or a YAG laser after carrying out the above hydrogenation.

Next, a second interlayer insulating film 862 made of an inorganic insulating film material or organic insulating material is formed on the first interlayer insulating film 861. In this embodiment, an acrylic resin film with a thickness of 1.6 μm is formed, and that with a viscosity of 10 to 1000 cp, preferably, 40 to 200 cp, and that in which unevenness is formed on the surface is used.

In this embodiment, the second interlayer insulating film, on which unevenness is provided, is formed in order to prevent mirror reflection, whereby unevenness is formed on the surface of a pixel electrode. Furthermore, convex portions may be also formed in lower regions of the pixel electrode in order to obtain light scattering by forming unevenness on the surface of the pixel electrode. In that case, the convex portions can be formed by using the same photomask as that for forming a TFT. Therefore, the convex portions can be formed without increasing the number of the steps. Note that, the convex portions may be appropriately provided on the substrate in the pixel portion region besides a wiring and a TFT. Accordingly, unevenness is formed on the surface of the pixel electrode taking along the unevenness formed on the surface of an insulating film coating the convex portions.

In addition, as the second insulating film 862, a film of which surface is to bbe flatten may be also used. In that case, after the pixel electrode is formed, it is preferable that the surface is provided with unevenness by adding the steps of sand blasting, etching, and the like to prevent mirror reflection and to allow reflected light to scatter, thereby enhancing whiteness.

Furthermore, in a drive circuit 906, wirings 863 to 867 electrically connected to each impurity region are formed. Note that, these wirings are formed by patterning a laminated film of a Ti film with a film thickness of 50 nm and an alloy film (alloy film with Al and Ti) with a film thickness of 500 nm.

Moreover, a pixel electrode 870, a gate wiring 869, a connection electrode 868 are formed in a pixel portion 907. (FIG. 8) Due to the connection electrode 868, a source wiring 836 is electrically connected with a pixel TFT. Furthermore, the gate wiring 869 is electrically connected with a drain region of the pixel TFT. In addition, the pixel electrode 870 is electrically connected with a drain region 842 of the pixel TFT, and furthermore electrically connected with a semiconductor layer 858 that functions as one electrode constituting a storage capacitor. Moreover, as the pixel electrode 870, material excellent in reflectivity of such as a film mainly containing Al or Ag, or a laminated film thereof is desired to be used.

As described above, a driver circuit 906 having a CMOS circuit composed of an n-channel type TFT 901 and a p-channel type TFT 902, and an n-channel type TFT 903; and the pixel portion 907 having a pixel TFT 904 and a storage capacitor 905 can be formed on one substrate. Thus, an active matrix substrate is completed.

The n-channel type TFT 901 of the driver circuit 906 has a channel formation region 823c, the low-concentration impurity region 823b (GOLD region) overlapped with a first conductive layer 828a constituting a part of a gate electrode, and the high-concentration impurity region 823a that functions as a source region or a drain region. The p-channel type TFT 902 forming a CMOS circuit by connecting this n-channel type TFT 901 with the electrode 866 has a channel formation region 846d, impurity regions 846b and 846c formed outside of a gate electrode, and a high-concentration impurity region 846a that functions as a source region or a drain region. In addition, the n-channel type TFT 903 has a channel formation region 825c, a low-concentration impurity region 825b (GOLD region) overlapped with a first conductive layer 830a constituting a part of a gate electrode, and a high-concentration impurity region 825a that functions as a source region or a drain region.

The pixel TFT 904 of the pixel portion has a channel formation region 826c, a low-concentration impurity region 826b (LDD region) formed outside of the gate electrode, and a high-concentration impurity region 826a that functions as a source region or a drain region. In addition, an impurity element imparting p-type is respectively added to semiconductor layers 847*a*, 847*b* that function as one electrode of the storage capacitor 905. The storage capacitor 905 is formed of an electrode (lamination of 838*a* and 838*b*) and semiconductor layers 847*a* to 847*c*, taking the insulating layer 844 as a dielectric.

In addition, in the pixel configuration of this embodiment, the edges of the pixel electrode are disposed so as to be overlapped with a source wiring such that a gap between the pixel electrodes is light-shielded without using a black matrix.

Figure 8:
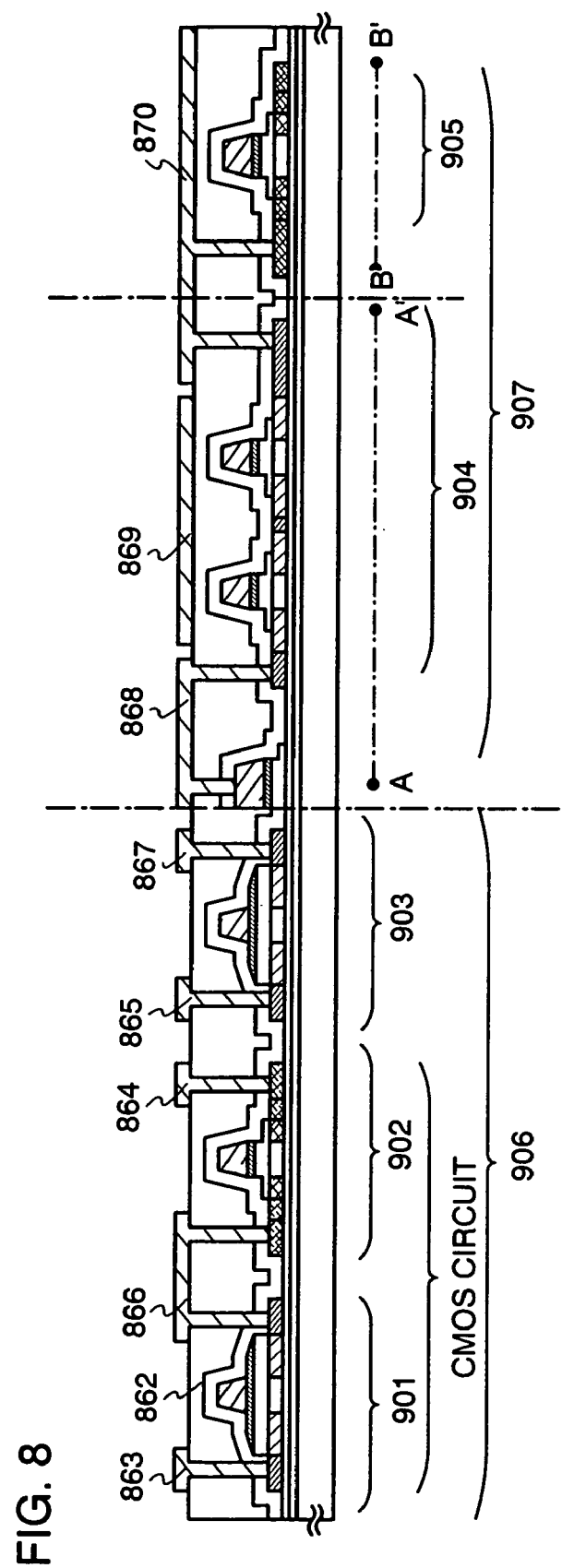
FIG. 8 is a drawing describing a step for manufacturing a TFT.
Figure 9:
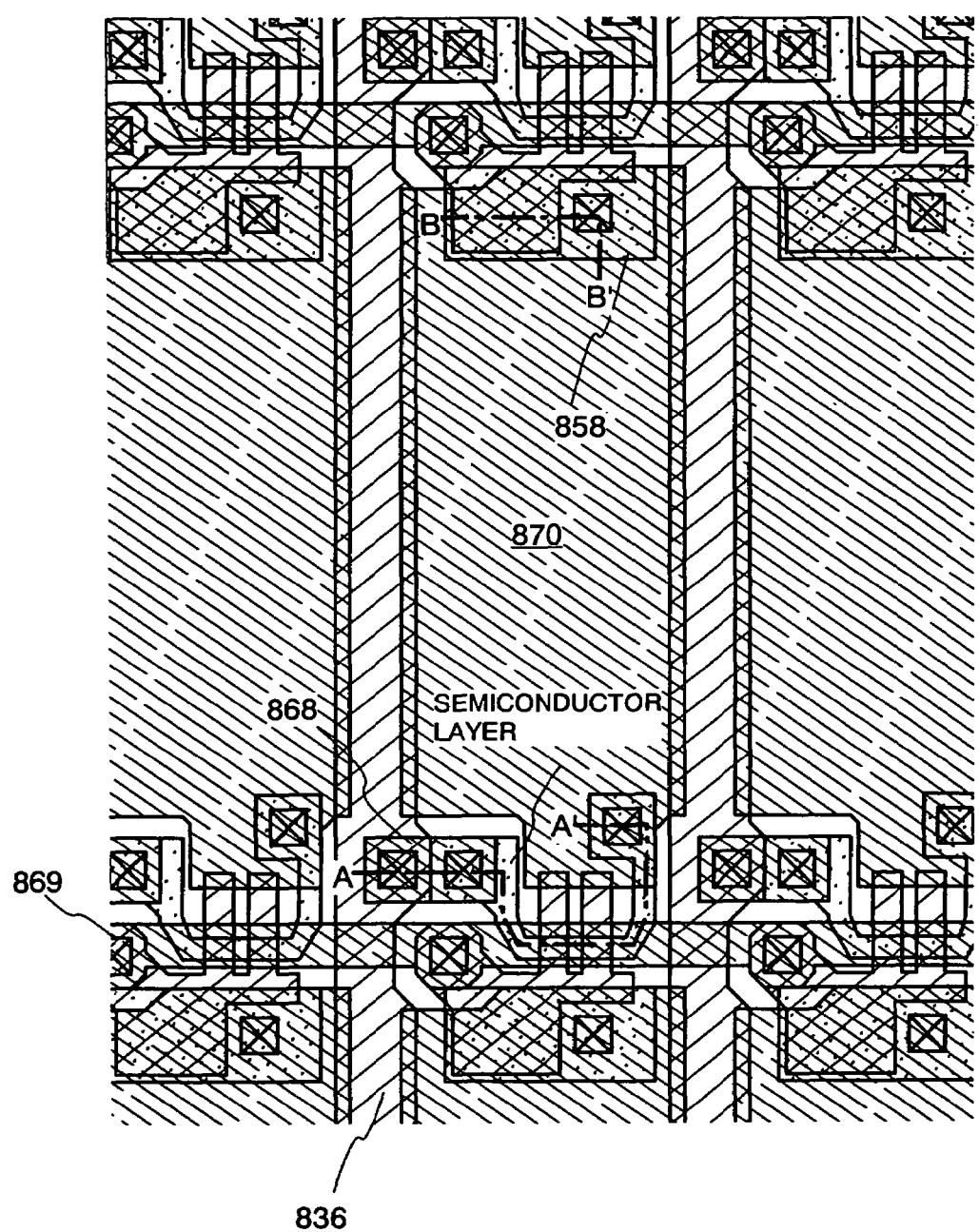
FIG. 9 is a top view of a pixel portion of a TFT.

Furthermore, FIG. 9 shows a top view of a pixel portion of an active matrix substrate manufactured in this embodiment. Note that, the same components to be corresponded are denoted by the same numerals as those of FIG. 5 to FIG. 8. A broken line A-A' in FIG. 8 corresponds to a cross-sectional view taken along at a broken line A-A' in FIG. 9. In addition, a broken line B-B' in FIG. 8 corresponds to a cross-sectional view taken along a broken line B-B' in FIG. 9.

Note that, in this embodiment, a laser irradiation device any one of Embodiment Mode 1 and 2 can be used.

Embodiment 2

Figure 10:
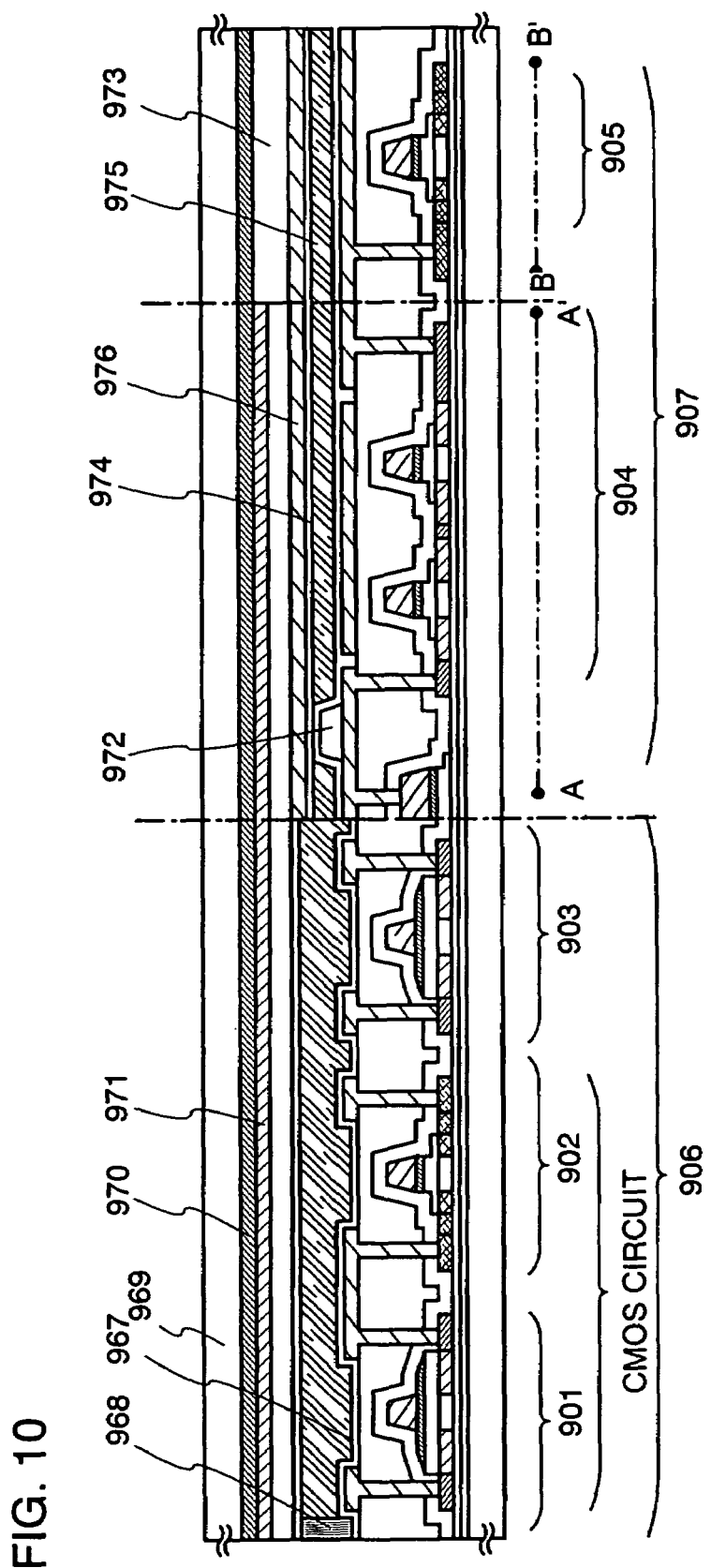
FIG. 10 is a cross-sectional view showing a step for manufacturing an active matrix type liquid crystal display device.

In this embodiment, a step for manufacturing a reflection type liquid crystal display device using the active matrix substrate manufactured in Embodiment 1 will be described below with reference to FIG. 10.

First, according to Embodiment 1, the active matrix substrate as shown in FIG. 8 is obtained. Thereafter, an alignment film 967 is formed at least on the pixel electrode 870 over the active matrix substrate of FIG. 8 to carry out a rubbing treatment. Note that, in this embodiment, an organic resin film such as acryl resin film is patterned before forming the alignment film 967, whereby a column-shaped spacer 972 for holding a substrate gap is formed at a desired position. Furthermore, spherical spacers may be scattered over the entire surface of the substrate, in stead of the column-shaped spacer.

Then, a counter substrate 969 is prepared. A coloring layer 970, a leveling film 973 are formed on the counter substrate 969. In addition, the red coloring layer 970 is overlapped with a blue coloring layer 971 to form a light-shielding portion at the place to be light-shielded. At this time, it may be also possible that the red coloring layer is partially overlapped with a green coloring layer to form a light-shielding portion.

In this embodiment, the substrate described in Embodiment 1 is used. Therefore, it is required that at least the gap between the gate wiring 869 and the pixel electrode 870, the gap between the gate wiring 869 and the connection electrode 868, and the gap between the connection electrode 868 and the pixel electrode 870 should be light-shielded in FIG. 9 showing a top view of the pixel portion of Embodiment 1. In the present embodiment, each coloring layer is disposed so that a light-shielding portion composed of a lamination of coloring layer is overlapped with the positions to be light-shielded.

Accordingly, the gap between each pixel is light-shielded with a light-shielding portion composed of a lamination of coloring layers, whereby the number of steps can be reduced without forming a light-shielding layer such as a black mask.

Then, a counter electrode 976 composed of a transparent conductive film is formed on a leveling film 973 at least in the pixel portion, and an alignment film 974 is formed over the entire surface of the counter substrate, whereby a rubbing treatment is carried out.

Then, the active matrix substrate on which the pixel portion and the driver circuit are formed is attached to the counter substrate with a sealant 968. Filler is mixed in the sealant 968, and two substrates are attached at a uniform interval with the filler and the column spacer. Thereafter, a liquid crystal material 975 is injected between the both substrates, and the substrates are completely sealed with a sealant (not shown). A known liquid crystal material may be used for the liquid crystal material 975. Thus, the reflection type liquid crystal display device shown in FIG. 10 is completed. Then, the active matrix substrate or the counter substrate is separated in a desired shape if necessary. Furthermore, a polarizing plate (not shown) is attached only to the counter substrate. Then, a flexible printed circuit (FPC) is attached.

The liquid crystal display panel thus manufactured as described above can be used as a display portion of various electronic device.

Embodiment 3

In this embodiment, an example in which a light-emitting device is manufactured using the present invention is described. In this specification, a light-emitting device collectively refers to a display panel in which a light-emitting element formed on a substrate is sealed between the substrate and a display module in which an IC is mounted on the display panel. Note that, a light-emitting element has a layer (light-emitting layer) containing an organic compound that can obtain luminescence (electroluminescence) generated by applying an electric field, an anode layer, and a cathode layer. Furthermore, luminescence in an organic compound includes a light-emitting (fluorescence) obtained when a singlet excited state returns to a normal state and a light-emitting (phosphorescence) obtained when a triplet excited state returns to a normal state. Either one of or both of light-emitting is included.

Figure 11:
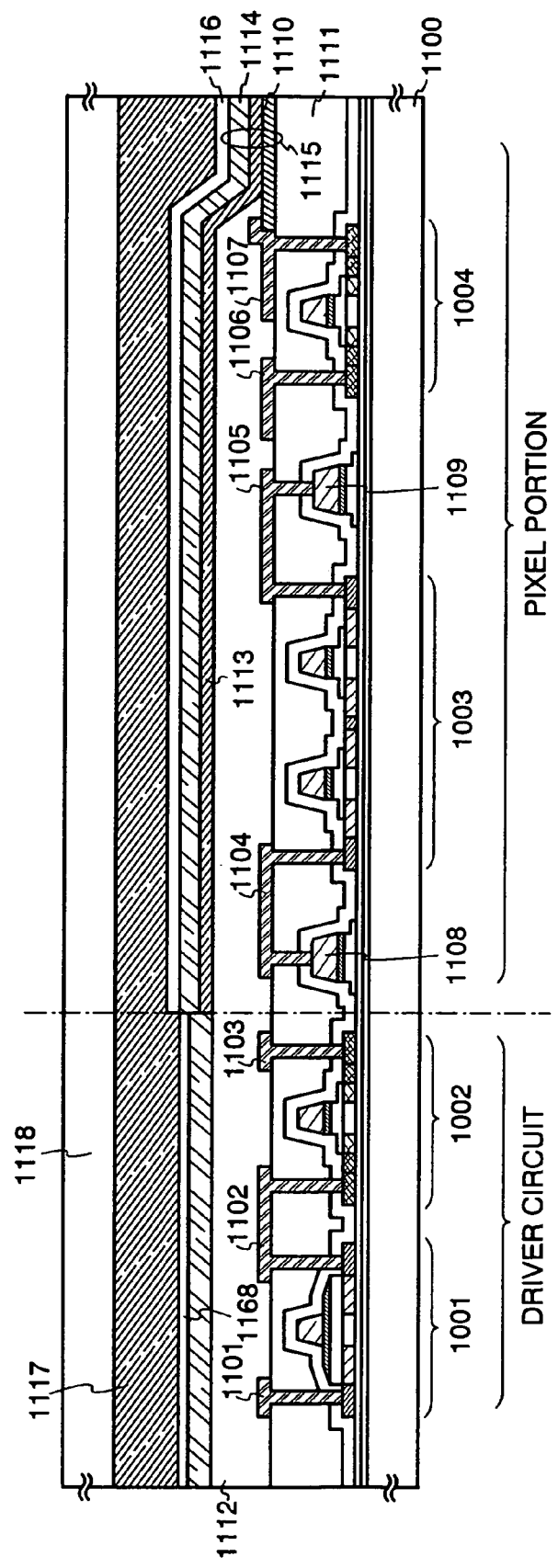
FIG. 11 is a cross-sectional structure view of a driver circuit and a pixel portion of a light-emitting device.

FIG. 11 is a cross-sectional view of light-emitting device of this embodiment. In FIG. 11, a switching TFT 1003 provided on a substrate 1100 is formed using an n-channel type TFT 904. Therefore, the description of the configuration may be referred to that of the n-channel type TFT 904.

Note that, although this embodiment shows a double-gate structure in which that two channel formation regions are formed, a single-gate structure in which one channel formation region is formed or a triple-gate structure in which three channel formation regions are formed may be also used.

A driver circuit provided on the substrate 1100 is formed using the CMOS circuits of FIG. 8. Therefore, the description of the n-channel type TFT 901 and the p-channel type TFT 902 may be referred to the description of the configuration of the driver circuit. Note that, although this embodiment shows a single-gate structure, a double-gate structure or a triple-gate structure may also be used.

Furthermore, wirings 1101 and 1103 function as source wirings of CMOS circuits, and a wiring 1102 functions as a drain wiring. In addition, a wiring 1104 functions as a wiring that electrically connects a source wiring 1108 and a source region of a switching TFT, and a wiring 1105 functions as a wiring that electrically connects a drain wiring 1109 and a drain region of a switching TFT.

Note that, a current control TFT 1004 is formed by using the p-channel type TFT 902 of FIG. 8. Therefore, the description of the current control TFT 1004 may be referred to the description of the configuration of the p-channel type TFT 902. Note that, although this embodiment shows a single-gate structure, a double-gate structure or a triple-gate structure may also be used.

Furthermore, a wiring 1106 is a source line (corresponding to a current supply line) of the current control TFT, and reference numeral 1107 denotes an electrode that is electrically connected to a pixel electrode 1110 by being overlapped with the pixel electrode 1110 of the current control TFT.

Note that, reference numeral 1110 is the pixel electrode comprised of a transparent conductive film (an anode of light-emitting element). As the transparent conductive film, a compound of indium oxide and tin oxide, a compound of indium oxide and zinc oxide, zinc oxide, tin oxide or indium oxide can be used. Furthermore, the transparent conductive film with gallium added thereto may be also used. The pixel electrode 1110 is formed on a flat interlayer insulating film 1111 before forming the above wirings. In this embodiment, it is very important to flatten the step difference due to TFTs using the leveling film 1111 made of resin. A light-emitting layer to be formed later is very thin, so that a light-emission defects may be caused due to the presence of the step difference. Therefore, it is desirable to flatten the surface before forming the pixel electrode so that the light-emitting layer can be formed on a flat surface.

After the wirings 1101 to 1107 are formed, a bank 1112 is formed as shown in FIG. 11. The bank 1112 may be formed by patterning an insulating film containing silicon or an organic resin film of 100 to 400 nm.

Note that, care should be taken to electrostatic discharge damage of an element during a film formation since the bank 1112 is made of an insulating film. In this embodiment, resistivity is decreased by adding the carbon particles or the metal particles to an insulating film that will be a material of the bank 1112, whereby static electricity is suppressed. At this time, the adding amount of the carbon particles or the metal particles may be regulated so that resistivity will be $1 \times 10^6$ to $1 \times 10^{12}$ Ωm (preferably, $1 \times 10^8$ to $1 \times 10^{10}$ Ωm).

A light-emitting layer 1113 is formed on the pixel electrode 1110. Note that, although only one pixel is shown in FIG. 11, light-emitting layers are formed so as to correspond to R (red), G (green), and B (blue) in this embodiment. Furthermore, in this embodiment, a low molecular-weight organic light-emitting material is formed by a vapor deposition. Specifically, a layered structure is used in which a copper phthalocyanine (CuPc) film with a thickness of 20 nm is provided as a hole injection layer, and a tris-8-quinolinolatoaluminum complex (Alq$_3$) film with a thickness of 70 nm is provided thereover as a light-emitting layer. A light-emitting color can be controlled by adding a fluorochrome such as quinacridon, perylene or DCM 1 to Alq$_3$.

It should be noted that an exemplary organic light-emitting material which can be used as a light-emitting layer has been described above; however, this embodiment is not necessarily limited thereto. A light-emitting layer (for a light-emitting and for moving a carrier therefore) may be formed by arbitrarily combining a light-emitting layer, a charge transport layer or a charge injection layer. In this embodiment, for example, a low molecular-weight organic light-emitting material used as a light-emitting layer is exemplified; however, a high molecular-weight organic light-emitting material may be also used. Furthermore, it is also possible to use an inorganic material such as silicon carbide as a charge transport layer or a charge injection layer. As the organic light-emitting material and an inorganic material, a known material can be used.

Next, a cathode 1114 made of a conductive film is provided on the light-emitting layer 1113. In this embodiment, an alloy film of aluminum and lithium is used as a conductive film. Needless to say, a MgAg film (alloy film of magnesium and silver) may be also used. As a material for a cathode, a conductive film made of an element belonging to Group 1 or Group 2 of the periodic table, or a conductive film with these elements added thereto may be used.

When the cathode 1114 is formed, a light-emitting element 1115 is completed. Note that, the light-emitting element 1115 herein refers to a diode formed of the pixel electrode (anode) 1110, the light-emitting layer 1113, and the cathode 1114.

It is effective to provide a passivation film 1116 so as to cover the light-emitting element 1115 completely. As the passivation film 1116, a single-layer or a lamination of an insulating film including a carbon film, a silicon nitride film, or a silicon oxynitride film is used.

In this case, a film with satisfactory coverage is preferably used as a the passivation film. It is effective to use a carbon film, particularly, DLC (diamond-like carbon) film. Since the DLC film can be formed in a temperature range from room temperature to 100° C. or less, the DLC film can be easily formed even above the light-emitting layer 1113. Furthermore, the DLC film can control oxidation of the light-emitting layer 1113 due to a high blocking effect with respect to oxygen. Therefore, the light-emitting layer 1113 can be prevented from being oxidized while the subsequent sealing step is carried out.

Furthermore, a sealing material 1117 is provided on the passivation film 1116, and a covering material 1118 is attached to the sealant 1117. As the sealant 1117, a ultraviolet curable resin may be used, and it is effective to provide a material having inside moisture-absorption effect or a material having an antioxidation effect in the sealant 1117. Moreover, in this embodiment, a glass substrate, a quartz substrate, or a plastic substrate (including a plastic film) with a carbon film (preferably, a diamond-like carbon film) formed on the both sides thereof is used as the covering material 1118.

Accordingly, the light-emitting device having a configuration as shown in FIG. 11 is completed. Note that, it is effective to process continuously the step, in which the passivation film 1116 is formed after bank 1112 is formed, without being exposed to the atmosphere using a deposition device of a multi-chamber system (or an in-line system). Furthermore, it is also possible to process continuously the step up to attaching the covering material 1118 without being exposed to the atmosphere.

Accordingly, an n-channel type TFT 1001 and a p-channel type TFT 1002, the switching TFT (n-channel type TFT) 1003, and the current control TFT (p-channel type TFT) 1004 are formed over an insulator 1301 mainly consisting of a plastic substrate. The number of masks necessary for the steps up to here is less than that of a general active matrix type light-emitting device.

In other words, a step for manufacturing a TFT is largely simplified, which can realize improvement of a yield rate and decrease of a manufacturing cost.

Furthermore, as described with reference to FIG. 11, an n-channel TFT that is unlikely to be degraded due to a hot-carrier effect can be formed by providing impurity regions overlapped by interposing an insulating film in a gate electrode. Therefore, this embodiment can realize a highly reliable light-emitting device.

Furthermore, in this embodiment, only configurations of a pixel portion and a driver circuit are shown. However, according to the manufacturing step of this embodiment, logic circuits such as a signal division circuit, a D/A converter, an operational amplifier, and a γ-correction circuit can be formed on the one insulator. Furthermore, a memory and a microprocessor can be also formed.

Furthermore, the light-emitting device of this embodiment after the sealing (or encapsulation) step for protecting a light-emitting element is carried out is described with reference to FIG. 12. Note that, if necessary, reference numerals used in FIG. 11 are cited.

Figure 12A:
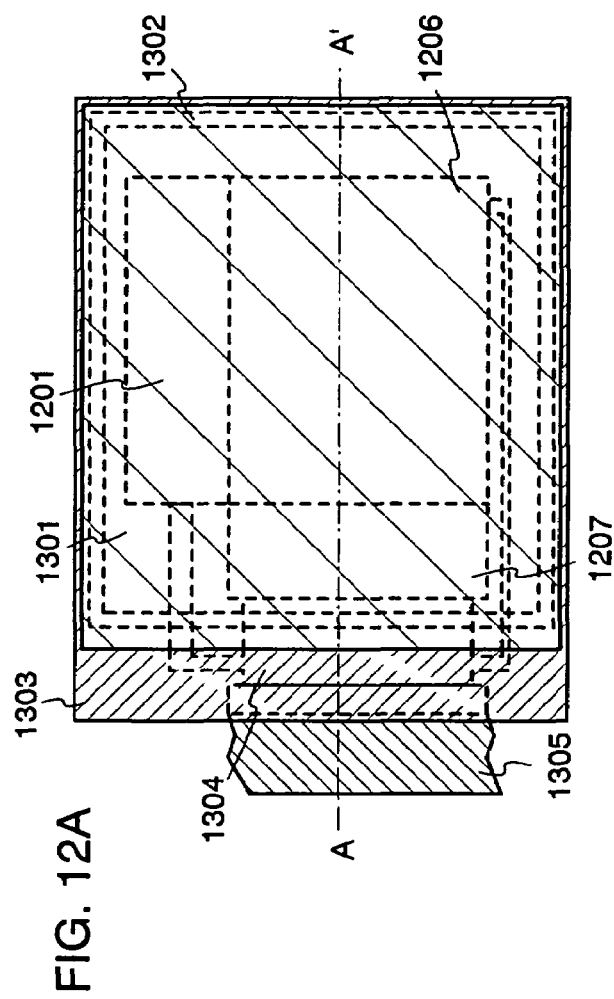
FIGS. 12A and 12B are drawings showing a driver circuit and a pixel portion of a light-emitting device.
Figure 12B:
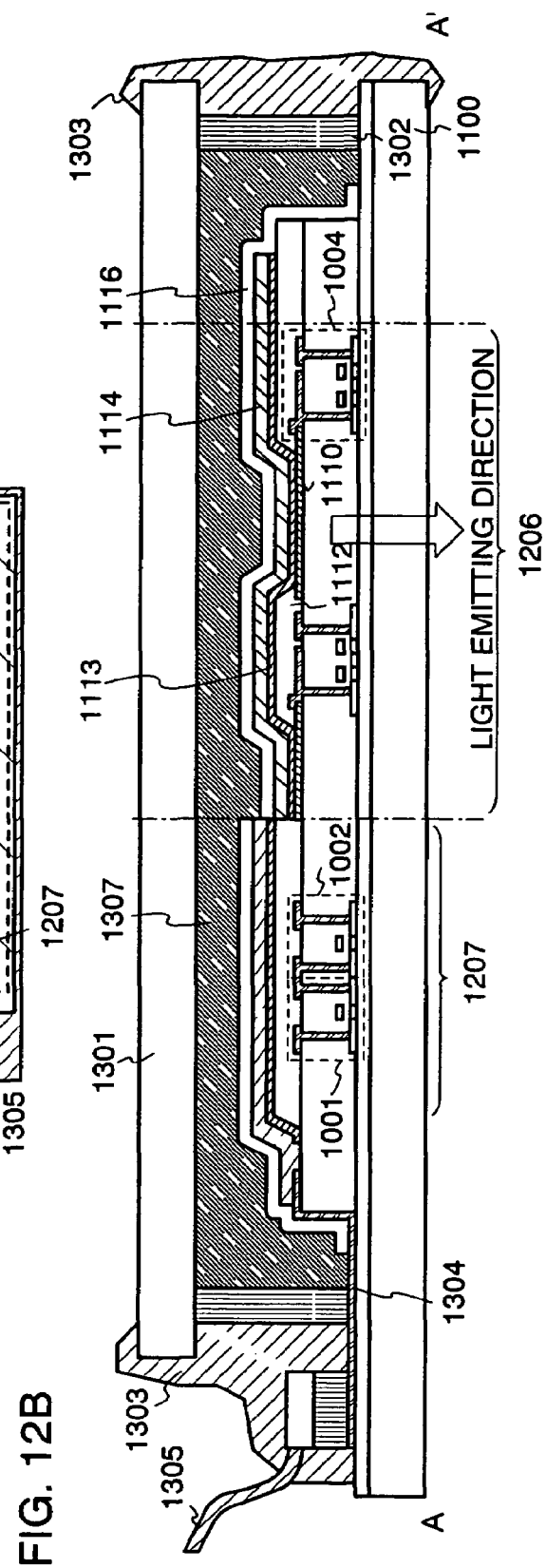

FIG. 12A is a top view showing a state in which sealing of a light-emitting element is completed. FIG. 12B is a cross-sectional view taken along a line C-C' in FIG. 12A. Portions surrounded with dotted lines and denoted with reference numeral 1201, 1206, and 1207 are a source-side driver circuit, a pixel portion, and a gate-side driver circuit, respectively. Furthermore, the reference numeral 1301 denotes a covering material, reference numeral 1302 denotes a first sealant, reference numeral 1303 denotes a second sealant, and a sealing material 1307 is provided in an inner portion surrounded with the first sealant 1302.

Note that, reference numeral 1304 denotes a wiring for transmitting a signal input to the source-side driver circuit 1201 and the gate-side driver circuit 1207, which receives a video signal and a clock signal from a flexible printed circuit (FPC) 1305 that will be an external input terminal. Herein, although only a FPC is shown, a printed wiring board (PWB) may be also attached to the FPC. The light-emitting device in this specification includes not only a light-emitting device itself but also a state that a light-emitting device is attached also to an FPC or a PWB.

Next, a cross-sectional configuration is described with reference to FIG. 12B. The pixel portion 1206, the gate-side driver circuit 1207 are formed above the substrate 1100. The pixel portion 1206 is composed of a plurality of pixels including the current control TFT 1004 and the pixel electrode 1110 electrically connected to a drain of thereof. Furthermore, the gate-side driver circuit 1207 is formed using a CMOS circuit (see FIG. 11) obtained by combining the n-channel type TFT 1001 with the p-channel TFT 1002.

The pixel electrode 1110 functions as an anode of a light-emitting element. In addition, the bank 1112 is formed at the both ends of the pixel electrode 1110, which forms the light-emitting layer 1113 and the cathode 1114 of a light-emitting element on the pixel electrode 1110.

The cathode 1114 also functions as a wiring common to all pixels, which is electrically connected to the FPC 1305 via the connection wiring 1304. Furthermore, all elements contained in the pixel portion 1206 and the gate-side driver circuit 1207 are coated with the cathode 1114 and the passivation film 1116.

In addition, the covering material 1301 is attached to the first sealant 1302. Note that, spacers made of a resin film may be provided so as to ensure a gap between the covering material 1301 and a light-emitting element. Then, an inner portion of the first sealant 1302 is filled with the sealing material 1307. Note that, it is preferable to use epoxy resin as the first sealant 1302, the sealing material 1307. In addition, it is desirable that the first sealant 1302 is a material unlikely to transmit moisture and oxygen as much as possible. Furthermore, the sealing material 1307 may contain inside a material having a moisture-absorption effect and an antioxidant effect.

The sealing material 1307 provided so as to cover the light-emitting element also functions as an adhesive for attaching the covering material 1301. In addition, in this embodiment, a fiberglass-reinforced plastic (FRP), polyvinyl fluoride (PVF), mylar, polyester or acryl can be used as a material of a plastic substrate 1301a constituting the covering material 1301.

Furthermore, after the covering material 1301 is attached using the sealing material 1307, the second sealant 1303 is provided so as to coat the side surface (an exposed surface) of the sealing material 1307. The second sealant 1303 can be made of the same material as that of the first sealant 1302.

By sealing the light-emitting element with the sealing material 1307 in the above configuration, the light-emitting element can be completely shut off from the outside, whereby a material accelerating degradation of the light-emitting layer due to oxidation, such as moisture and oxygen, can be prevented from entering from the outside. Thus, a highly reliable light-emitting device can be obtained.

Embodiment 4

In this embodiment, a semiconductor device into which an active matrix display device by TFT circuit of the present invention is incorporated is described with reference to FIG. 13, FIG. 14, and FIG. 15.

Followings are examples of thus semiconductor device: a portable information terminal (an electronic notebook, a mobile computer, a cellular phone, and the like), a video camera, a still camera, a personal computer, a television, or the like. These examples are shown in FIG. 13 and FIG. 14.

Figure 13A:
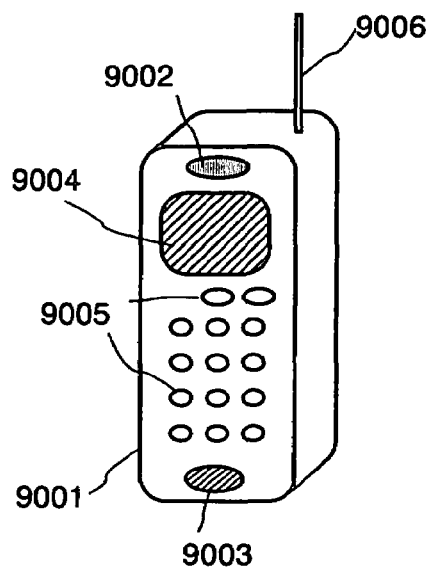
FIGS. 13A to 13E are views showing an example of a semiconductor device.

FIG. 13A is a cellular phone, which is composed of a main body 9001, an audio output portion 9002, an audio input portion 9003, a display device 9004, an operation switch 9005, and an antenna 9006. The invention can be applied to the audio output portion 9002, the audio input portion 9003, and the display device 9004 equipped with an active matrix substrate.

Figure 13B:
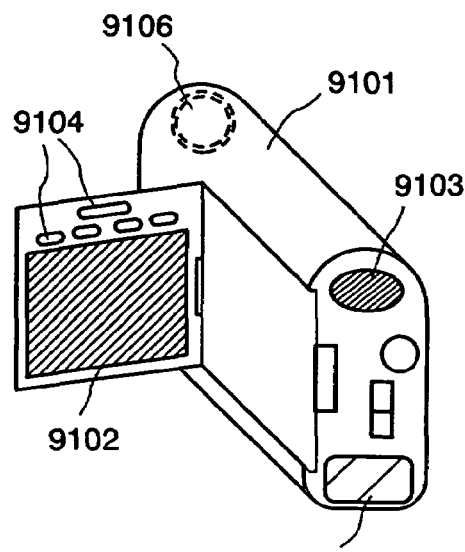

FIG. 13B is a video camera, which is composed of a main body 9101, a display device 9102, an audio input portion 9103, an operation switch 9104, a battery 9105, and an image receiving portion 9106. The invention can be applied to the audio input portion 9103, the display device 9102 equipped with an active matrix substrate, and the image receiving portion 9106.

Figure 13C:
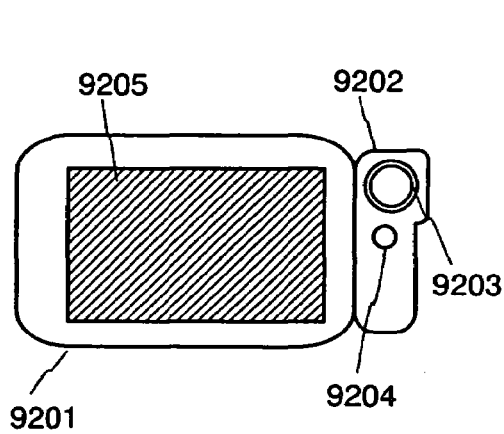

FIG. 13C is a mobile computer or a portable information terminal, which is composed of a main body 9201, a camera portion 9202, an image receiving portion 9203, an operation switch 9204, and a display device 9205. The invention can be applied to the image receiving portion 9203, and the display device 9205 equipped with an active matrix substrate.

Figure 13D:
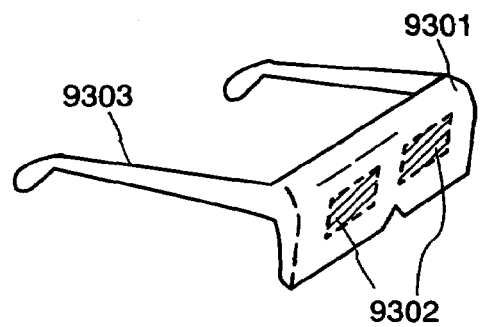

FIG. 13D is a goggle type display, which is composed of a main body 9301, a display device 9302, and an arm part 9303. The invention can be applied to the display device 9302. In addition, although not shown, the present invention can be also applied to other signal controlling circuits.

Figure 13E:
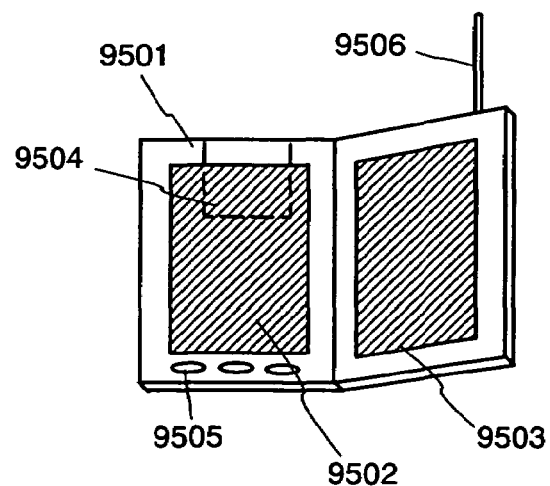

FIG. 13E is a mobile book, which is composed of a main body 9501, display devices 9502 and 9503, a memory medium 9504, an operation switch 9505, and an antenna 9506 to display data recorded in a minidisk (MD) and DVD or data received with the antenna. The display device 9502 and 9503 are the display devices of a direct viewing type, which the invention can be applied thereto.

Figure 14A:
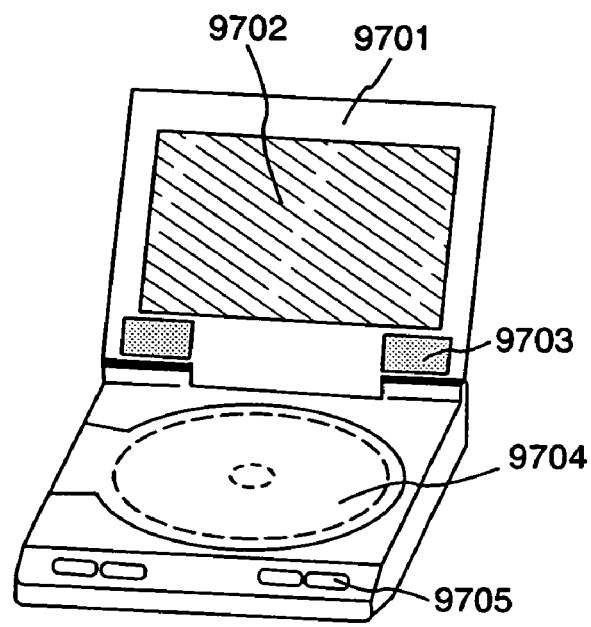
FIGS. 14A to 14C are views showing an example of a semiconductor device.

FIG. 14A is a player using a recording medium (referred to as, a recording medium) that recorded a program, which is composed of a main body 9701, a display device 9702, a speaker portion 9703, a recording medium 9704, and an operation switch 9705. Note that, this device uses a digital versatile disk (DVD), a CD, and the like as a recording medium, which can be used for listening to music, seeing movies, playing games, and performing the Internet.

Figure 14B:
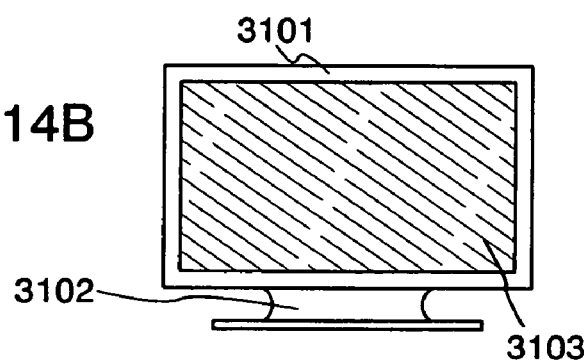

FIG. 14B is a television, which is composed of a main body 3101, a support table 3102, and a display portion 3103.

Figure 14C:
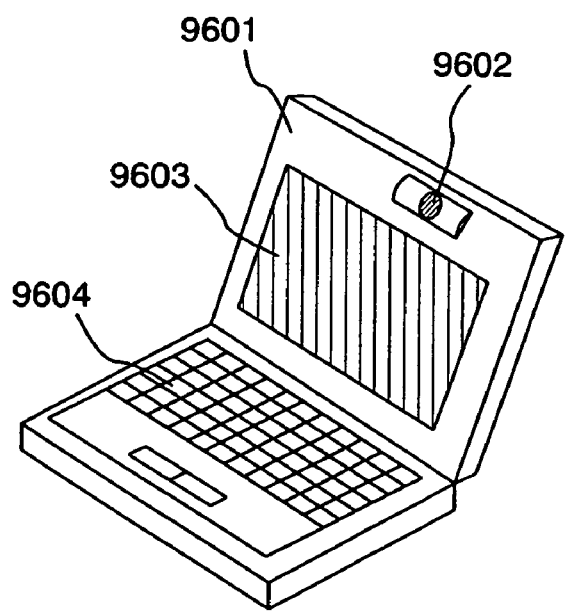

FIG. 14C is a personal computer, which is composed of a main body 9601, an image input portion 9602, a display device 9603, and a keyboard 9604.

Figure 15A:
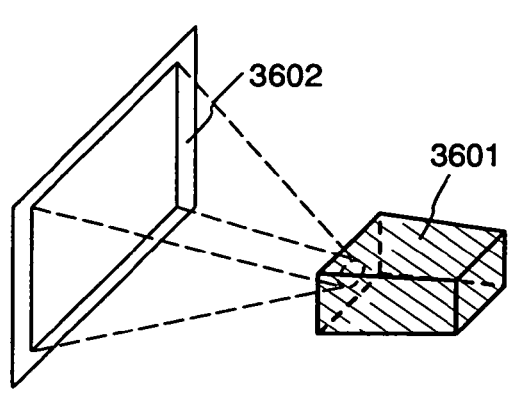
FIGS. 15A to 15D are views showing an example of a semiconductor device.

FIG. 15A is a front type projector, which is composed of a projection device 3601, and a screen 3602. The invention can be applied to a display device and other signal control circuits.

Figure 15B:
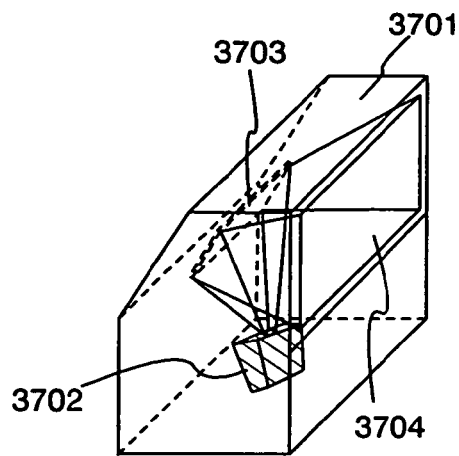

FIG. 15B is a rear type projector, which is composed of a main body 3701, a projection device 3702, a mirror 3703, and a screen 3704. The invention can be applied to a display device and other signal control circuits.

Figure 15C:
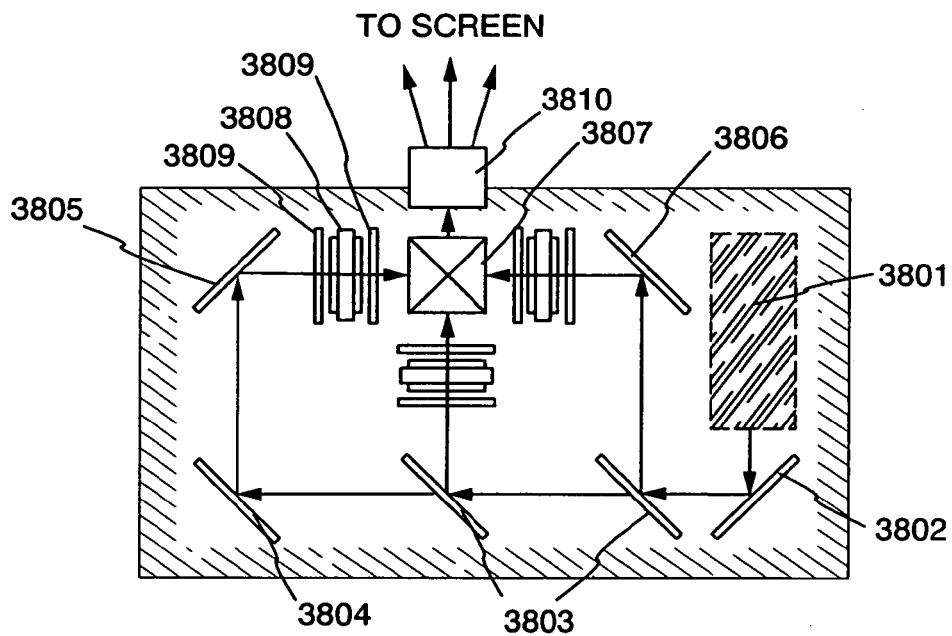

Note that, FIG. 15C is a view showing exemplary configuration of the projection devices 3601 and 3702 in FIG. 15A and FIG. 15B. The projection devices 3601 and 3702 are composed of a light source optical system 3801, a mirror 3802 and 3804 to 3806, a dichroic mirror 3803, a prism 3807, a liquid crystal display device 3808, a phase-contrast board 3809, and a projection optical system 3810. The projection optical system 3810 is composed of an optical system including a projected lens. In this embodiment, although an example of a three-boards type is shown, there is no particular limit thereto. For example, a single-board type may be also used. In addition, a person executing this embodiment may appropriately provide an optical system such as optical lens, a film having a polarization function, a film to regulate a phase contrast, an IR film, or the like in a light path shown in arrow in FIG. 15C.

Figure 15D:
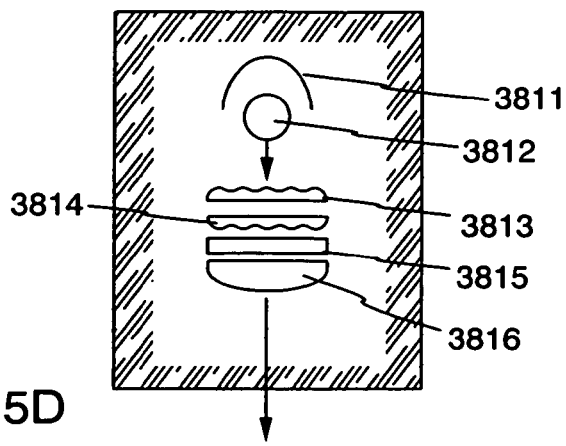

In addition, FIG. 15D is a view showing an exemplary configuration of the light source optical system 3801 in FIG. 15C. In this embodiment, the light source optical system 3801 is composed of a reflector 3811, a light source 3812, lens arrays 3813 and 3814, a polarization conversion element 3815, and a collective lens 3816. Note that, although the light source optical system shown in FIG. 15D is an example, there is no particular limit thereto. For example, a person executing this embodiment may appropriately provide an optical system such as optical lens, a film having a polarization function, a film to regulate a phase contrast, an IR film, or the like in the light source optical system.

Besides, the invention can be also applied to a luminescent display element. Accordingly, the range of application to the invention is extremely large and the invention is applicable to the various fields of electronic device. In addition, the electronic device of this embodiment can be arbitrarily combined with any one of Embodiments 1 to 3.

What is claimed is:

1. A laser irradiation method comprising:
   irradiating a subject formed over a substrate with a first pulse laser beam and a second pulse laser beam while relatively moving the subject so that areas which are irradiated with the first pulse laser beam and with the second pulse laser beam are overlapped with each other,
   wherein oscillations of the first pulse laser beam and the second pulse laser beam are synchronized,
   wherein a wavelength of the first pulse laser beam is equal to or shorter than that of visible light, and a wavelength of the second pulse laser beam is longer than that of the first pulse laser beam,
   wherein a pulse width of the first pulse laser beam and a pulse width of the second pulse laser beam are different from each other, and
   wherein the second pulse laser beam is a fundamental wave.

2. A laser irradiation method according to claim 1, wherein the first pulse laser beam is one selected from the group consisting of an Ar laser, a Kr laser, an excimer laser, a $CO_2$ laser, a YAG laser, a $Y_2O_3$ laser, a $YVO_4$ laser, a $GdVO_4$ laser, a YLF laser, a $YAlO_3$ laser, a glass laser; a ruby laser, an alexandrite laser, a Ti: sapphire laser, a copper vapor laser, and a gold vapor laser.

3. A laser irradiation method according to claim 1, wherein the second pulse laser beam is one selected from the group consisting of a $CO_2$ laser, a YAG laser, a $Y_2O_3$ laser, a $YVO_4$ laser, a $GdVO_4$ laser, a YLF laser, a $YAlO_3$ laser, a glass laser, an alexandrite laser, and a Ti: sapphire laser.

4. A laser irradiation method according to claim 1, wherein each of the first pulse laser beam and the second pulse laser beam is shaped into a linear beam.

5. A laser irradiation method according to claim 1, wherein the first pulse laser beam satisfies an inequality of $\phi 1 \geq \arctan(W1/2d)$, where $\phi 1$ is an incident angle of the first pulse laser beam, W1 is a length of a major axis or a minor axis of the first pulse laser beam, and d is a thickness of the substrate.

6. A laser irradiation method according to claim 1, wherein the second pulse laser beam satisfies an inequality of $\phi 2 \geq \arctan(W2/2d)$, where $\phi 2$ is an incident angle of the second pulse laser beam, W2 is a length of a major axis or a minor axis of the second pulse laser beam, and d is a thickness of the substrate.

7. A laser irradiation method comprising:
   irradiating a semiconductor film formed over a substrate with a first pulse laser beam and a second pulse laser beam while relatively moving the semiconductor film so that areas which are irradiated with the first pulse laser beam and with the second pulse laser beam are overlapped with each other,
   wherein oscillations of the first pulse laser beam and the second pulse laser beam are synchronized, and
   wherein the first pulse laser beam melts the semiconductor film, and the second pulse laser beam satisfies $\alpha \geq 10\beta$, where $\alpha$ denotes an absorption coefficient with respect to a molten state of the semiconductor film, and $\beta$ denotes an absorption coefficient with respect to a solid state of the semiconductor film.

8. A laser irradiation method according to claim 7, wherein the first pulse laser beam is one selected from the group consisting of an Ar laser, a Kr laser, an excimer laser, a $CO_2$ laser, a YAG laser, a $Y_2O_3$ laser, a $YVO_4$ laser, a $GdVO_4$ laser, a YLF laser, a $YAlO_3$ laser, a glass laser, a ruby laser, an alexandrite laser, a Ti: sapphire laser, a copper vapor laser, and a gold vapor laser.

9. A laser irradiation method according to claim 7, wherein the second pulse laser beam is one selected from the group consisting of a $CO_2$ laser, a YAG laser, a $Y_2O_3$ laser, a $YVO_4$ laser, a $GdVO_4$ laser, a YLF laser, a $YAlO_3$ laser, a glass laser, an alexandrite laser, and a Ti: sapphire laser.

10. A laser irradiation method according to claim 7, wherein each of the first pulse laser beam and the second pulse laser beam is shaped into a linear beam.

11. A laser irradiation method according to claim 7, wherein the first pulse laser beam satisfies an inequality of $\phi 1 \geq \arctan(W1/2d)$, where $\phi 1$ is an incident angle of the first pulse laser beam, W1 is a length of a major axis or a minor axis of the first pulse laser beam, and d is a thickness of the substrate.

12. A laser irradiation method according to claim 7, wherein the second pulse laser beam satisfies an inequality of $\phi 2 \geqq \arctan(W2/2d)$, where $\phi 2$ is an incident angle of the second pulse laser beam, W2 is a length of a major axis or a minor axis of the second pulse laser beam, and d is a thickness of the substrate.

13. A laser irradiation method comprising:
irradiating a semiconductor film formed over a substrate with a first pulse laser beam and a second pulse laser beam while relatively moving the semiconductor film so that areas which are irradiated with the first pulse laser beam and with the second pulse laser beam are overlapped with each other,
wherein oscillations of the first pulse laser beam and the second pulse laser beam are synchronized, and
wherein the first pulse laser beam has a wavelength range of which an absorption coefficient with respect to a solid state of the semiconductor film is $5\times 10^3$/cm or more, and the second pulse laser beam has a wavelength of which an absorption coefficient with respect to a solid state of the semiconductor film is $5\times 10^2$/cm or less and an absorption coefficient with respect to a molten state of the semiconductor film is $5\times 10^3$/cm or more.

14. A laser irradiation method according to claim 13, wherein the first pulse laser beam is one selected from the group consisting of an Ar laser, a Kr laser, an excimer laser, a $CO_2$ laser, a YAG laser, a $Y_2O_3$ laser, a $YVO_4$ laser, a $GdVO_4$ laser, a YLF laser, a $YAlO_3$ laser, a glass laser, a ruby laser, an alexandrite laser, a Ti: sapphire laser, a copper vapor laser,and a gold vapor laser.

15. A laser irradiation method according to claim 13, wherein the second pulse laser beam is one selected from the group consisting of a $CO_2$ laser, a YAG laser, a $Y2O_3$ laser, a $YVO_4$ laser, a $GdVO_4$ laser, a YLF laser, a $YAlO3$ laser, a glass laser, an alexandrite laser, and a Ti: sapphire laser.

16. A laser irradiation method according to claim 13, wherein each of the first pulse laser beam and the second pulse laser beam is shaped into a linear beam.

17. A laser irradiation method according to claim 13, wherein the first pulse laser beam satisfies an inequality of $\phi 1 \geqq \arctan(W1/2d)$, where $\phi 1$ is an incident angle of the first pulse laser beam, WI is a length of a major axis or a minor axis of the first pulse laser beam, and d is a thickness of the substrate.

18. A laser irradiation method according to claim 13, wherein the second pulse laser beam satisfies an inequality of $\phi 2 \geqq \arctan(W2/2d)$, where $\phi 2$ is an incident angle of the second pulse laser beam, W2 is a length of a major axis or a minor axis of the second pulse laser beam, and d is a thickness of the substrate.

19. A method for manufacturing a semiconductor device comprising:
forming an amorphous semiconductor film over a substrate;
crystallizing the amorphous semiconductor by irradiating the amorphous semiconductor film with a laser beam;
patterning the crystalline semiconductor film into a semiconductor layer; and
forming a channel formation region including at least a part of the semiconductor layer,
wherein areas which are irradiated with a first pulse laser beam and with a second pulse laser beam are overlapped with each other,
wherein oscillations of the first pulse laser beam and the second pulse laser beam are synchronized;

wherein a wavelength of the first pulse laser beam is equal to or shorter than that of visible light, and a wavelength of the second pulse laser beam is longer than that of the first pulse laser beam,
wherein a pulse width of the first pulse laser beam and a pullse width of the second Dulse laser beam are different from each other, and wherein the second Dulse laser beam is a fundamental wave.

20. A method for manufacturing a semiconductor device according to claim 19, wherein the first pulse laser beam is emitted from a laser selected from the group consisting of an Ar laser, a Kr laser, an excimer laser, a $CO_2$ laser, a YAG laser, a $Y_2O_3$ laser, a $YVO_4$ laser, a $GdVO_4$ laser, a YLF laser, a $YAlO_3$ laser, a glass laser, a ruby laser, an alexandrite laser, a Ti: sapphire laser, a copper vapor laser, and a gold vapor laser.

21. A method for manufacturing a semiconductor device according to claim 19, wherein the second pulse laser beam is emitted from a laser selected from the group consisting of a $CO_2$ laser, a YAG laser, a $Y_2O_3$ laser, a $YVO_4$ laser, a $GdVO_4$ laser, a YLF laser, a $YAlO_3$ laser, a glass laser, an alexandrite laser, and a Ti: sapphire laser.

22. A method for manufacturing a semiconductor device according to claim 19, wherein the first pulse laser beam and the second pulse laser beam are respectively shaped into linear beams.

23. A method for manufacturing a semiconductor device according to claim 19, wherein the first pulse laser beam satisfies an inequality of $\phi 1 \geqq \arctan(W1/2d)$, where $\phi 1$ is an incident angle of the first pulse laser beam, W1 is a length of a major axis or a minor axis of the first pulse laser beam, and d is a thickness of the substrate.

24. A method for manufacturing a semiconductor device according to claim 19, wherein the second pulse laser beam satisfies an inequality of $\phi 2 \geqq \arctan(W2/2d)$, where $\phi 2$ is an incident angle of the second pulse laser beam, W2 is a length of a major axis or a minor axis of the second pulse laser beam, and d is a thickness of the substrate.

25. A method for manufacturing a semiconductor device comprising:
forming an amorphous semiconductor film over a substrate;
crystallizing the amorphous semiconductor film by irradiating the amorphous semiconductor film with a laser beam;
patterning the crystalline semiconductor film into a semiconductor layer; and
forming a channel formation region including at least part of the semiconductor layer,
wherein areas which are irradiated with the first pulse laser beam and with the second pulse laser beam are overlapped with each other,
wherein oscillations of the first pulse laser beam and the second pulse laser beam are synchronized, and
wherein the first pulse laser beam melts the semiconductor film, and the second pulse laser beam satisfies $\alpha \geqq 10\beta$, where $\alpha$ denotes an absorption coefficient with respect to a molten state of the semiconductor film, $\beta$ denotes an absorption coefficient with respect to a solid state of the semiconductor film.

26. A method for manufacturing a semiconductor device according to claim 25, wherein the first pulse laser beam is emitted from a laser selected from the group consisting of an Ar laser, a Kr laser, an excimer laser, a $CO_2$ laser, a YAG laser, a $Y_2O_3$ laser, a $YVO_4$ laser, a $GdVO_4$ laser, a YLF laser, a YAlO$_3$ laser, a glass laser, a ruby laser, an alexandrite laser, a Ti: sapphire laser, a copper vapor laser, and a gold vapor laser.

27. A method for manufacturing a semiconductor device according to claim 25, wherein the second pulse laser beam is emitted from a laser selected from the group consisting of a CO$_2$ laser, a YAG laser, a Y$_2$O$_3$ laser, a YVO$_4$ laser, a GdVO$_4$ laser, a YLF laser, a YAlO$_3$ laser, a glass laser, an alexandrite laser, and a Ti: sapphire laser.

28. A method for manufacturing a semiconductor device according to claim 25, wherein the first pulse laser beam and the second pulse laser beam are respectively shaped into linear beams.

29. A method for manufacturing a semiconductor device according to claim 25, wherein the first pulse laser beam satisfies an inequality of $\phi 1 \geq \arctan(W1/2d)$, where $\phi 1$ is an incident angle of the first pulse laser beam, W1 is a length of a major axis or a minor axis of the first pulse laser beam, and d is a thickness of the substrate.

30. A method for manufacturing a semiconductor device according to claim 25, wherein the second pulse laser beam satisfies an inequality of $\phi 2 \geq \arctan(W2/2d)$, where $\phi 2$ is an incident angle of the second pulse laser beam, W2 is a length of a major axis or a minor axis of the second pulse laser beam, and d is a thickness of the substrate.

31. A method for manufacturing a semiconductor device comprising:
    forming an amorphous semiconductor film over a substrate;
    crystallizing the amorphous semiconductor film by irradiating the amorphous semiconductor film with a laser beam;
    patterning the crystalline semiconductor film into a semiconductor layer; and
    forming a channel formation region including at least a part of the semiconductor layer,
    wherein areas which are irradiated with the first pulse laser beam and with the second pulse laser beam are overlapped with each other,
    wherein oscillations of the first pulse laser beam and the second pulse laser beam are synchronized, and
    wherein the first pulse laser beam has a wavelength range of which an absorption coefficient with respect to a solid state of the semiconductor film is $5 \times 10^3$/cm or more, and the second pulse laser beam has a wavelength of which an absorption coefficient with respect to a solid state of the semiconductor film is $5 \times 10^2$/cm or less and an absorption coefficient with respect to a molten state of the semiconductor film is $5 \times 10^3$/cm or more.

32. A method for manufacturing a semiconductor device according to claim 31, wherein the first pulse laser beam is emitted from a laser selected from the group consisting of an Ar laser, a Kr laser, an excimer laser, a CO$_2$ laser, a YAG laser, a Y$_2$O$_3$ laser, a YVO$_4$ laser, a GdVO$_4$ laser, a YLF laser, a YAlO$_3$ laser, a glass laser, a ruby laser, an alexandrite laser, a Ti: sapphire laser, a copper vapor laser, and a gold vapor laser.

33. A method for manufacturing a semiconductor device according to claim 31, wherein the second pulse laser beam is emitted from a laser selected from the group consisting of a CO$_2$ laser, a YAG laser, a Y$_2$O$_3$ laser, a YVO$_4$ laser, a GdVO$_4$ laser, a YLF laser, a YAlO$_3$ laser, a glass laser, an alexandrite laser; and a Ti: sapphire laser.

34. A method for manufacturing a semiconductor device according to claim 31, wherein the first pulse laser beam and the second pulse laser beam are respectively shaped into linear beams.

35. A method for manufacturing a semiconductor device according to claim 31, wherein the first pulse laser beam satisfies an inequality of $\phi 1 \geq \arctan(W1/2d)$, where $\phi 1$ is an incident angle of the first pulse laser beam, W1 is a length of a major axis or a minor axis of the first pulse laser beam, and d is a thickness of the substrate.

36. A method for manufacturing a semiconductor device according to claim 31, wherein the second pulse laser beam satisfies an inequality of $\phi 2 \geq \arctan(W2/2d)$, where $\phi 2$ is an incident angle of the second pulse laser beam, W2 is a length of a major axis or a minor axis of the second pulse laser beam, and d is a thickness of the substrate.

* * * * *